(12) United States Patent
Kim et al.

(10) Patent No.: US 10,107,486 B2
(45) Date of Patent: Oct. 23, 2018

(54) LIGHT EMITTING DIODE MODULE

(71) Applicant: SAMSUNG ELECTRONICS CO., LTD., Suwon-si (KR)

(72) Inventors: Jae-sung Kim, Yongin-si (KR); Tae-hee Song, Gunpo-si (KR); Young-hyo Eun, Asan-si (KR); Shin-min Rhee, Seoul (KR); Ju-hyun Song, Cheonan-si (KR); Sang-woo Ha, Seongnam-si (KR); In-je Sung, Paju-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 168 days.

(21) Appl. No.: 15/189,616

(22) Filed: Jun. 22, 2016

(65) Prior Publication Data

US 2017/0023213 A1 Jan. 26, 2017

(30) Foreign Application Priority Data

Jul. 24, 2015 (KR) .................. 10-2015-0105289

(51) Int. Cl.
| | |
|---|---|
| F21V 3/00 | (2015.01) |
| F21V 23/00 | (2015.01) |
| H01L 33/58 | (2010.01) |
| G02F 1/1335 | (2006.01) |

(52) U.S. Cl.
CPC ............ F21V 23/005 (2013.01); H01L 33/58 (2013.01); G02F 1/133603 (2013.01); G02F 2001/133607 (2013.01)

(58) Field of Classification Search
CPC . F21V 23/005; F21V 5/00; F21V 5/04; F21V 5/046; F21V 5/048; H01L 33/58; G02F 1/133603; G02F 2001/133607

USPC .................................................... 362/311.02
See application file for complete search history.

(56) References Cited

U.S. PATENT DOCUMENTS

| | | |
|---|---|---|
| 6,372,608 B1 | 4/2002 | Shimoda et al. |
| 6,645,830 B2 | 11/2003 | Shimoda et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,470,936 B2 | 12/2008 | Takekuma |
| 7,501,656 B2 | 3/2009 | Han et al. |

(Continued)

FOREIGN PATENT DOCUMENTS

| | | |
|---|---|---|
| KR | 10-1060236 B1 | 8/2011 |
| KR | 10-1131686 B1 | 3/2012 |

(Continued)

*Primary Examiner* — Anh Mai
*Assistant Examiner* — Meghan Ulanday
(74) *Attorney, Agent, or Firm* — Sughrue Mion, PLLC

(57) ABSTRACT

Provided is a light emitting diode (LED) module. The LED module includes: a light emitting chip on a substrate; and an optical lens on the substrate configured to envelop the light emitting chip, wherein the optical lens includes a body comprising a groove receiving the light emitting chip therein and having a dome-shaped upper surface and a ring-shaped supporting portion protruding from a lower surface of the body.

18 Claims, 30 Drawing Sheets

(56) References Cited

U.S. PATENT DOCUMENTS

| | | |
|---|---|---|
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,192,068 B2 | 6/2012 | Kwon et al. |
| 8,213,093 B2 | 7/2012 | Bak et al. |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,585,239 B1 | 11/2013 | Tseng |
| 8,735,931 B2 | 5/2014 | Han et al. |
| 8,761,221 B2 | 6/2014 | Oki et al. |
| 8,766,295 B2 | 7/2014 | Kim |
| 8,963,197 B2 | 2/2015 | Han et al. |
| 8,939,618 B2 | 6/2015 | Kawahara et al. |
| 2012/0105739 A1 | 5/2012 | Shimizu |
| 2014/0168970 A1 | 6/2014 | Choi et al. |
| 2015/0029692 A1 | 1/2015 | Chung et al. |

FOREIGN PATENT DOCUMENTS

| | | |
|---|---|---|
| KR | 10-1338211 B1 | 12/2013 |
| KR | 10-2015-0012091 A | 2/2015 |
| KR | 10-2015-0033929 A | 4/2015 |

LIGHT EMITTING DIODE MODULE

CROSS-REFERENCE TO RELATED APPLICATION

This application claims priority from Korean Patent Application No. 10-2015-0105289, filed on Jul. 24, 2015, in the Korean Intellectual Property Office, the disclosure of which is incorporated herein in its entirety by reference.

BACKGROUND

Apparatuses and methods consistent with exemplary embodiments relate to a light emitting diode module, and more particularly, to a light emitting diode module including an optical lens attached directly to a printed circuit board.

A light emitting diode (LED) has long lifespan, low power, small size, and high durability. Thus, the LED is widely used for a backlight unit providing light at a back side of a liquid crystal display panel or used as a light source of various illumination devices. In this case, to improve an optical efficiency of the LED, an optical lens may be arranged on an upper side of the LED.

SUMMARY

One or more exemplary embodiments may provide a light emitting diode (LED) module which includes an optical lens and can improve precision in attachment of an optical lens and productivity of a mounting process.

According to an aspect of an exemplary embodiment, there is provided a light emitting diode (LED) module including: a light emitting chip on a substrate; and an optical lens on the substrate configured to envelop the light emitting chip, wherein the optical lens may include: a body comprising a groove receiving the light emitting chip therein and having a dome-shaped upper surface; and a ring-shaped supporting portion protruding from a lower surface of the body.

The LED module may further include an LED package, including a cup-structured package body in which the light emitting chip is arranged, on the substrate.

The groove may envelop at least a portion of a sidewall of the LED package.

The supporting portion may envelop a side wall of the LED package.

The supporting portion may include at least two arcs.

Each of the at least two arcs may form a portion of an imaginary circle, portions may be located at a constant distance from a center of the groove, the at least two arcs may be spaced apart from each other by a gap measured along the imaginary circle, and each of the at least two arcs may be longer than the gap measured along the imaginary circle.

Each of the at least two arcs may have the same length.

The gap may be a path for discharging heat generated from the LED package.

The supporting portion and the substrate may be secured to each other via an adhesive, and the adhesive may be formed in a portion of a region in which the substrate and the supporting portion adjoin each other.

The substrate may be a printed circuit board.

The LED module may further include a controller arranged on the substrate.

According to an aspect of another exemplary embodiment, there is provided a light emitting diode (LED) module including: a light emitting chip mounted on a substrate; and an optical lens configured to envelop the light emitting chip, wherein the optical lens may include: a body comprising a groove receiving the light emitting chip therein and having a dome-shaped upper surface; and a plurality of supporting portions configured to protrude from a lower surface of the body and to be arranged at a constant distance from a center of the groove.

The plurality of supporting portions may be arranged in an imaginary circle, and adjoining supporting portions among the plurality of supporting portions may be offset from each other by 60 degrees or less along an imaginary circle.

The adjoining supporting portions among the plurality of supporting portions may be offset from each other by a constant angle along the imaginary circle.

The optical lens may further include a sidewall along an edge of the body, and the sidewall may include at least three alignment marks arranged at a constant distance from the center of the groove.

The at least three alignment marks may be holes penetrating through the sidewall.

A central portion of the body may have a recessed shape.

According to an aspect of another exemplary embodiment, there is provided an optical lens for a light emitting diode (LED) module, the optical lens including: a body having a dome structure and comprising a groove receiving an LED package including a light emitting chip on a substrate; a supporting portion having a ring structure and protruding from a lower surface of the body; and a sidewall along an edge of the body.

The supporting portion may include a plurality of arcs which are arranged in an imaginary circle at a constant distance from a center of the groove and are spaced apart from each other by a gap measured along the imaginary circle.

The sidewall may include at least three alignment marks arranged at a constant distance from the center of the groove.

BRIEF DESCRIPTION OF THE DRAWINGS

Exemplary embodiments will be more clearly understood from the following detailed description taken in conjunction with the accompanying drawings in which.

DETAILED DESCRIPTION OF EXEMPLARY EMBODIMENTS

Figure 1:
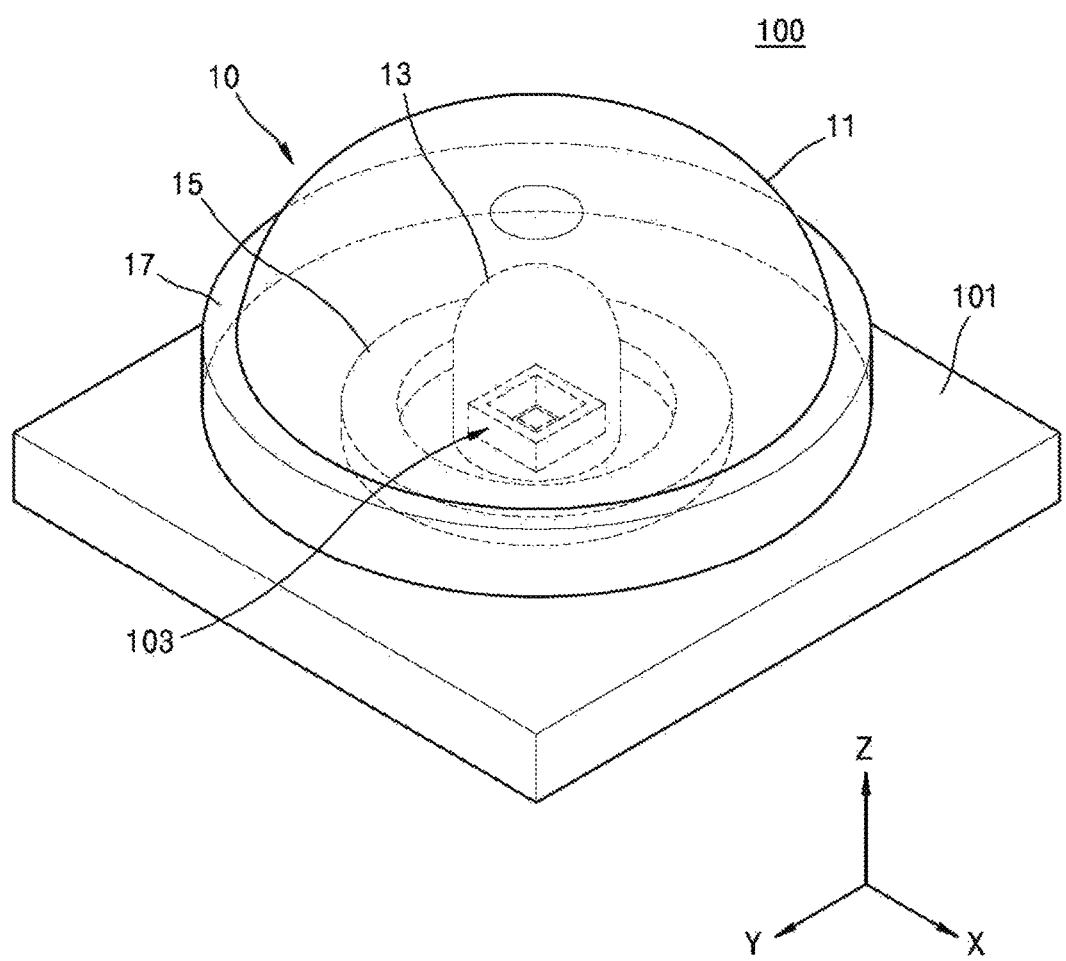
FIG. 1 is a perspective view of a light emitting diode (LED) module including an optical lens according to exemplary embodiment.

Hereinafter, exemplary embodiments will be described in detail with reference to the accompanying drawings Like elements will be denoted by like reference numerals throughout, and repeated descriptions thereof will be omitted.

As used herein, the term "and/or" includes any and all combinations of one or more of the associated listed items. Expressions such as "at least one of, "when preceding a list of elements, modify the entire list of elements and do not modify the individual elements of the list.

It should be understood that exemplary embodiments are provided for complete disclosure and thorough understanding of the inventive concept by those skilled in the art, and that the inventive concept is not limited to the exemplary embodiments disclosed herein and may be embodied in many different ways.

It will be understood that although the terms such as "first", "second" and the like may be used herein to describe various members, regions, layers, portions and/or components, these members, regions, layers, portions and/or components should not be limited by these terms. These terms do not imply a specific order, a relative upper or lower location, or relative superiority or inferiority, and are used only to distinguish one member, region, layer, portion, or component from other members, regions, layers, portions, or components. Thus, a first member, region, portion, or component, could be termed a second member, region, portion, or component without departing from the teachings of the inventive concept. For example, a first element could be termed a second element without departing from the scope of the inventive concept, and, similarly, a second element could also be termed a first element.

Unless otherwise defined, all terms used herein, including technical and scientific terms, have the same meaning as generally understood by those of ordinary skill in the art. It will be understood that terms, such as those defined in generally used dictionaries, should be interpreted as having a meaning that is consistent with meanings understood in the context of the related art, and will not be interpreted in an idealized or overly formal sense unless expressly so defined herein.

When an exemplary embodiment can be otherwise realized, specific processes may be performed in a different order from a described order. For example, two processes successively described may be substantially simultaneously performed, and may also be performed in an opposite order to a described order.

In the accompanying drawings, variations of illustrated shapes can be anticipated, for example, depending on fabrication techniques and/or tolerances. Thus, exemplary embodiments are not to be construed as being limited to specific shapes of regions illustrated herein, and are to be construed as including, for example, variations of shapes caused in the process of fabrication.

FIG. 1 is a perspective view of a light emitting diode (LED) module 100 including an optical lens 10 according to an exemplary embodiment.

Referring to FIG. 1, the LED module 100 includes an LED package 103 arranged on a substrate 101 and an optical lens 10 arranged on the substrate 101 so as to envelop a sidewall of the LED package 103. The optical lens 10 may include a body 11 and a supporting portion 15. The body 11 may have a groove 13 receiving the LED package 103 therein, and may have a dome-shaped upper surface. The supporting portion 15 may have a ring shape protruding from a lower surface of the body 11. The optical lens 10 may further include a sidewall 17 along an edge of the body 11.

Specifically, the substrate 101 may be a printed circuit board (PCB). That is, the substrate 101 may include a circuit pattern for supplying a driving signal to the LED package 103 mounted on the substrate 101.

The LED package 103 is arranged on the substrate 101. The LED package 103 may have a structure in which a light emitting chip is arranged in a cup-structured package body, the structure including a molding material covering the light emitting chip. The light emitting chip may be electrically connected to the package body in a manner of flip chip bonding or wire bonding. The package body may include an inner sidewall having a slope and thus reflect light generated from the light emitting chip toward a front side of the LED package 103. The molding material may include a phosphor mixed therein. However, the LED package 103 may have various structures, without being limited to the structure set forth above.

In FIG. 1, although only one LED package 103 is mounted on the substrate 101, the inventive concept is not limited thereto. The LED module 100 according to another exemplary embodiment may use a plurality of LED packages 103 mounted on the substrate 101 as a light source.

The optical lens 10 may be arranged on an upper side of the LED package 103 for improvement in an optical efficiency of the LED package 103. The optical lens 10 will be described in detail with reference to FIGS. 2A to 2E.

Figure 2A:
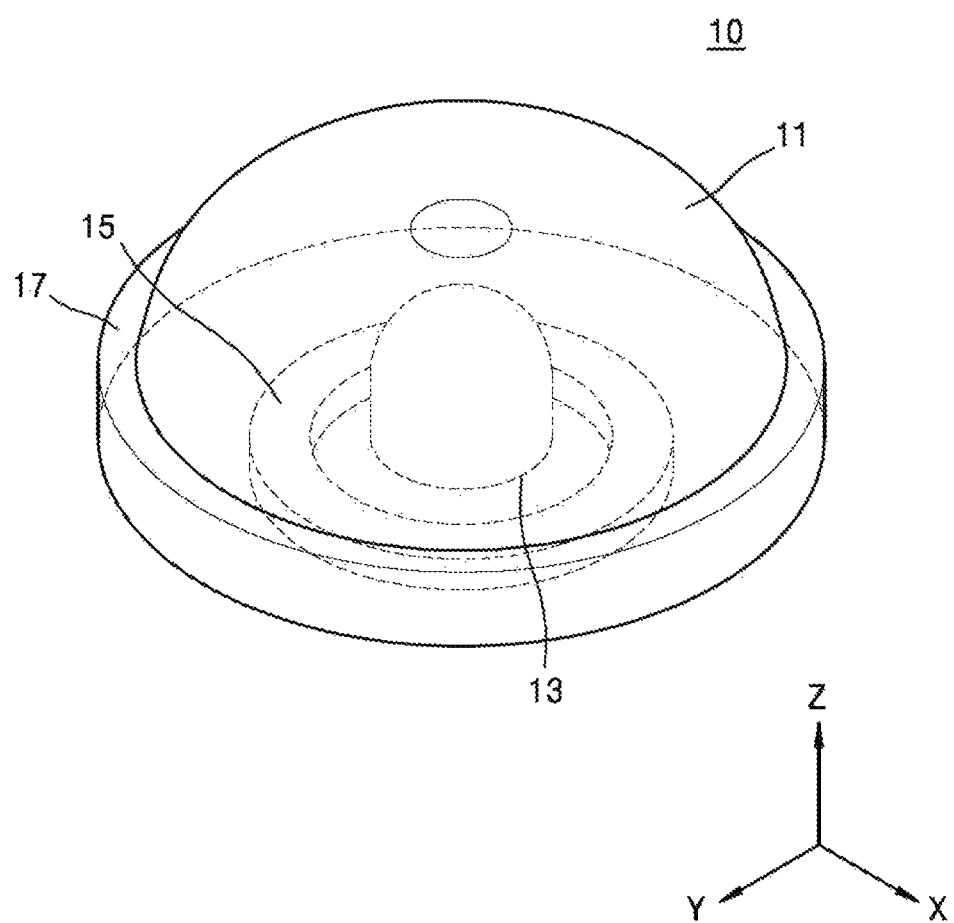
FIGS. 2A to 2E are perspective views, a plan view, a side view, and a sectional view of an optical lens included in the LED module of FIG. 1.
Figure 2B:
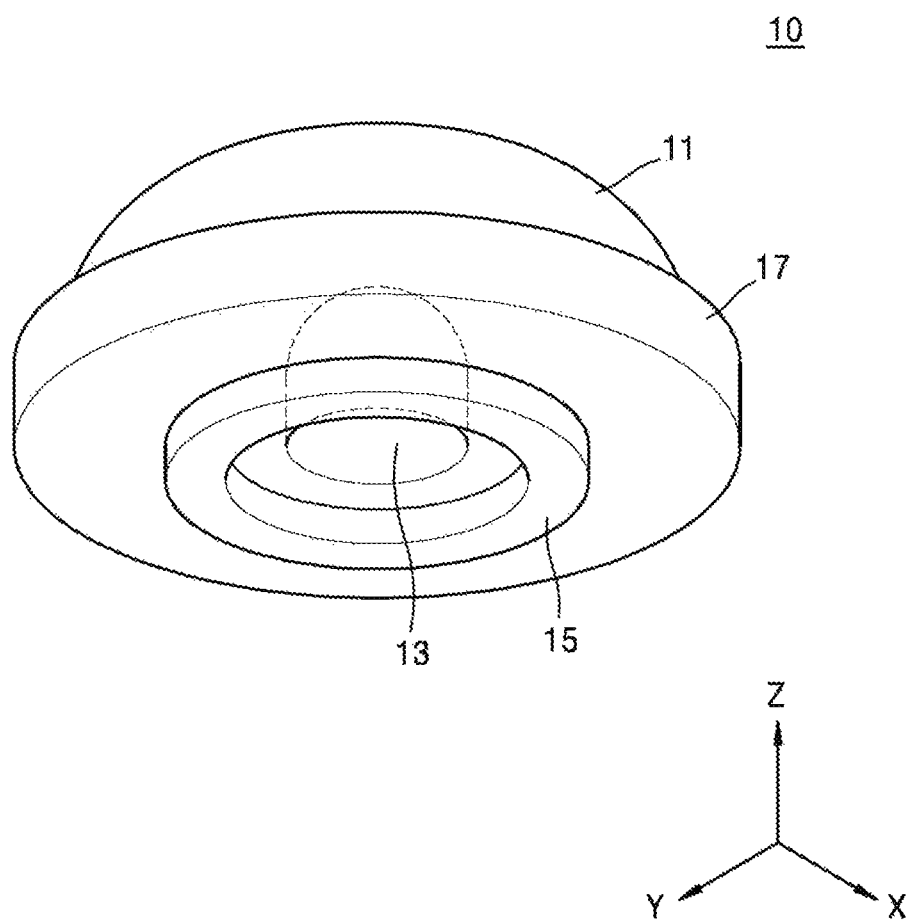
Figure 2C:
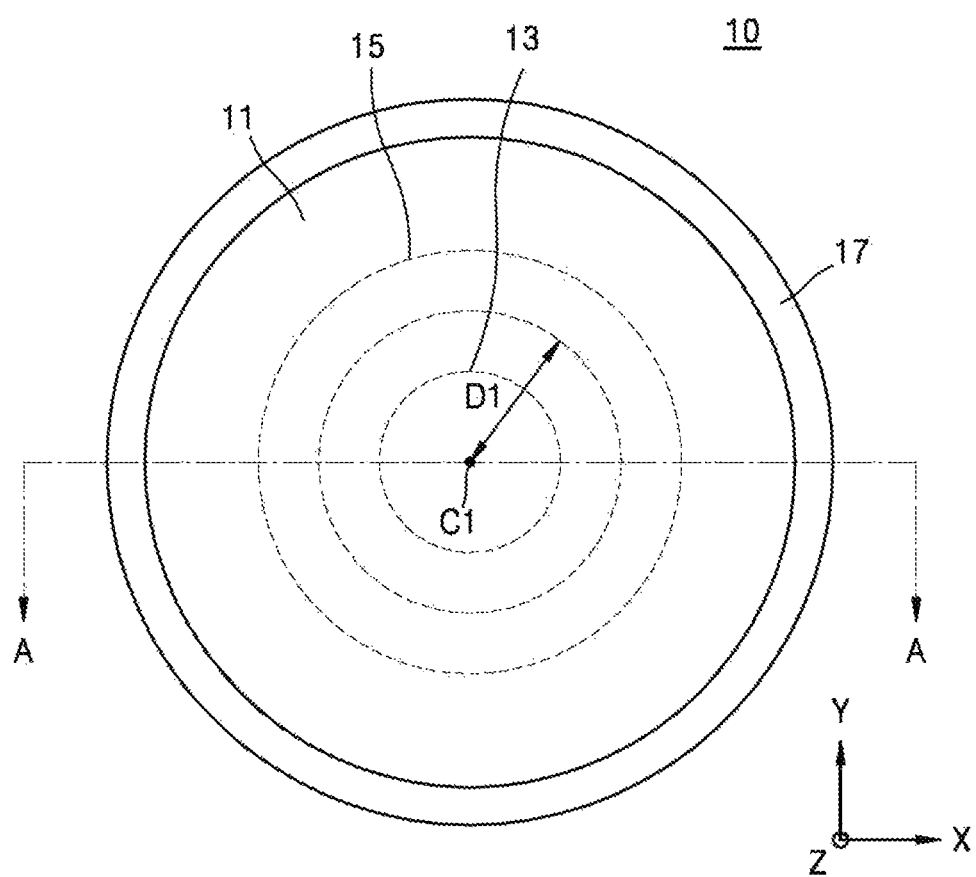
Figure 2D:
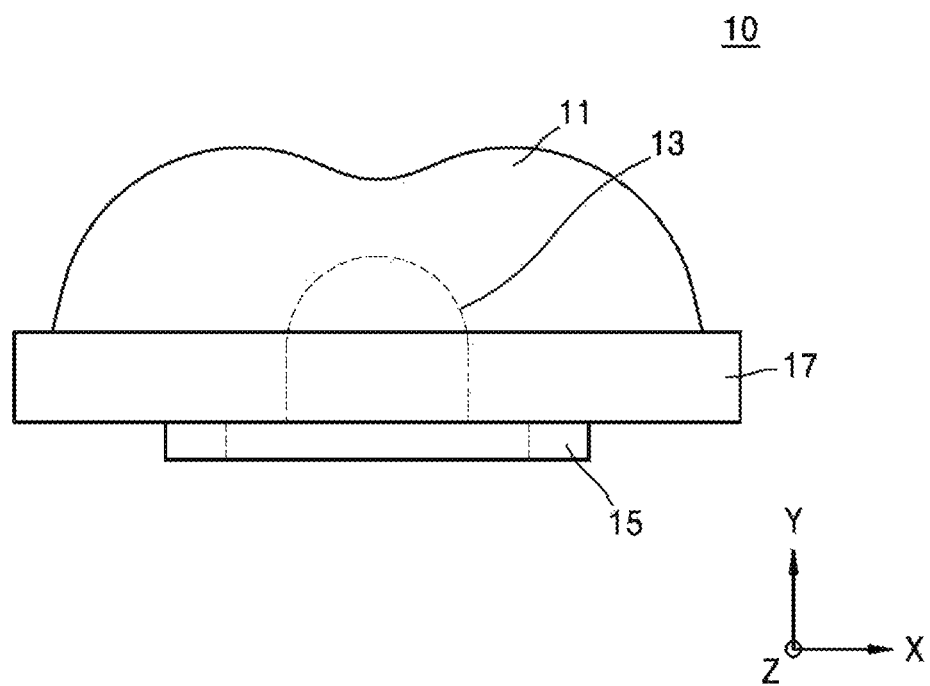
Figure 2E:
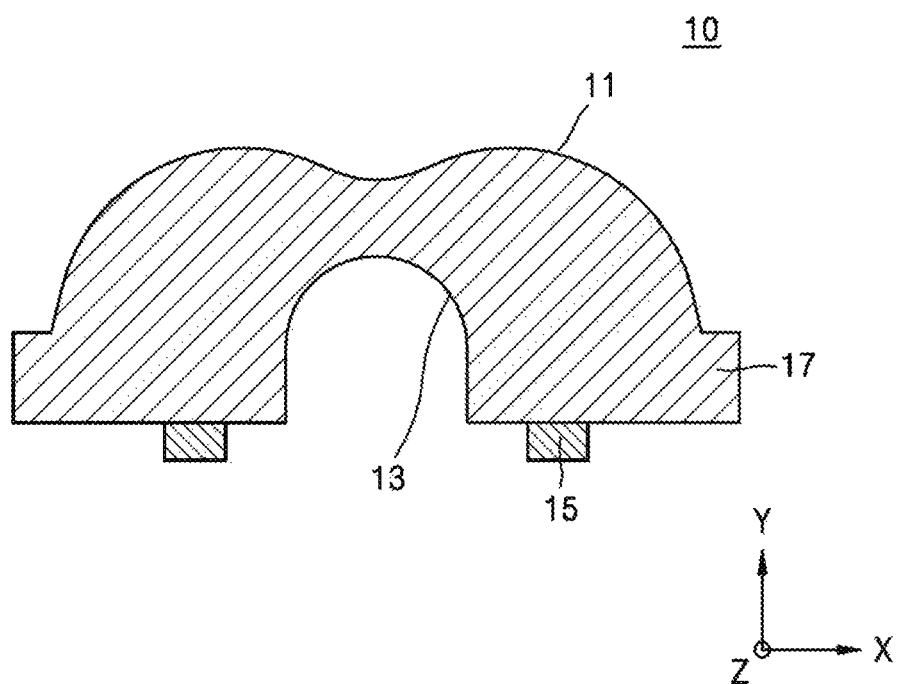

FIGS. 2A to 2E show the optical lens 10 included in the LED module 100 of FIG. 1. FIG. 2A is a perspective view showing the optical lens 10 from an upper side thereof. FIG. 2B is a perspective view showing the optical lens 10 from a lower side thereof. FIG. 2C is a plan view of the optical lens 10. FIG. 2D is a side view of the optical lens 10. FIG. 2E is a sectional view of the optical lens 10 taken along a line A-A of FIG. 2C. The same reference numerals refer to the same elements, and repeated elements will be described in brief.

Referring to FIGS. 1 and 2A to 2E, the optical lens 10 may include the body 11 and the supporting portion 15. In addition, the optical lens 10 may further include the sidewall 17 along the edge of the body 11.

The body 11 may have the groove 13 receiving the LED package 103 therein. The groove 13 may be a dome-shaped structure. The groove 13 may have a width wider than a width of the LED package 103 so as to envelop at least a portion of the sidewall of the LED package 103.

The body 11 may have the dome-shaped upper surface. Here, a central portion of the body 11 may have a recessed shape. That is, the body 11 may have a shape in which a thickness of a region overlapping the groove 13 is less than a thickness of a region not overlapping the groove 13.

However, the upper surface of the body 11 and the groove 13 are not limited to the shapes set forth above, and may have various shapes capable of more efficiently emitting light generated from the LED package 103.

The supporting portion 15 may have a ring shape protruding from the lower surface of the body 11 at a constant distance D1 from a center C1 of the groove 13. Therefore, the supporting portion 15 may not have directionality on a plane on which the supporting portion 15 is formed (an X-Y plane in FIG. 2C). Accordingly, there may not be a need of rotation alignment for direction correction when the optical lens 10 is mounted on the substrate 101.

In addition, the ring-shaped supporting portion 15 may have a simple structure in a side (X or Y directional) view (see FIG. 2D). Thus, when the optical lens 10 is transported on a transport rail to be introduced to the substrate 101, a simple fastening structure between the supporting portion 15 and the transport rail can allow the optical lens 10 not to suffer from a jam on the transport rail and can improve productivity of the LED module 100.

Specifically, a plurality of optical lenses 10 may be transported through a rail-shaped bulk feeder to be mounted on the substrate 101. The transported optical lenses 10 may be mounted on the substrate 101 by a mounter. Here, the optical lens 10 needs to be appropriately aligned with the LED package 103 which has been mounted.

To align the optical lens 10 with the LED package 103, the supporting portion 15 having an uneven structure may be used. The body 11 of the optical lens 10 may have the dome-shaped upper surface and the flat lower surface, and the supporting portion 15 may have an uneven structure protruding from the lower surface of the body 11.

That is, the plurality of optical lenses 10 are transported on the bulk feeder having grooves engaging with the uneven structure of the supporting portion 15, thereby being aligned during transport. The mounter moves the optical lenses 10, which has been subjected to position alignment on the bulk feeder, onto the substrate 101, whereby the optical lens 10 can be more precisely aligned with the LED package 103.

An uneven structure of a supporting portion included in a general optical lens may have a plurality of protrusions separated from each other in the form of islands. In this case, the bulk feeder needs to have a plurality of grooves respectively engaging with the plurality of separated protrusions.

Thus, the optical lens and the bulk feeder have a complicated fastening structure therebetween, and if any one of the plurality of protrusions of the supporting portion does not engage with the groove, the optical lens is not aligned on the bulk feeder. The optical lens which is not aligned may suffer from a jam on the bulk feeder, thereby delaying transport of the optical lens. In addition, in the process of removing the optical lens from the bulk feeder for realignment, the body of the optical lens can suffer from scratching.

However, in the optical lens 10 according to the present exemplary embodiment, the uneven structure of the supporting portion 15 included in the optical lens 10 may be a structure in which a ring shape located at a constant distance from the groove 13 of the body 11 protrudes from the lower surface of the body 11. That is, the uneven structure of the supporting portion 15 in a side view may have one quadrangular shape (see FIG. 2D). Since a groove of the bulk feeder is formed to engage with the uneven structure of the optical lens 10 in a side view, only one groove having a relatively wide width may be formed. The one supporting portion 15 engages with the one groove of the bulk feeder, whereby the optical lens 10 can be aligned on the bulk feeder.

As such, the simple fastening structure between the optical lens 10 and the bulk feeder can solve a problem of a jam of the optical lens on the bulk feeder or a problem of realignment of the optical lens 10. Thus, in the manufacture of the LED module 100 including the optical lens 10, productivity can be improved due to improvement in a feed speed of the optical lens 10, and an optical efficiency of the optical lens 10 can be improved due to improvement in scratches of the optical lens.

As will be described below with reference to FIGS. 13A and 13B, the optical lens 10 may be transported on a bulk feeder 1000. The supporting portion 15 of the optical lens 10 may engage with a groove 1000G of the bulk feeder 1000, whereby the optical lens 10 may be fastened to the bulk feeder 1000. Thus, the optical lens 10 may be aligned on the bulk feeder 1000.

In one or more exemplary embodiments, the supporting portion 15 may include at least two arcs. Gaps may be formed between the at least two arcs. That is, the ring-shaped supporting portion 15 may include the at least two arcs separated by the at least two gaps. These exemplary embodiments will be described in detail with reference to FIGS. 5A to 6B.

Figure 3A:
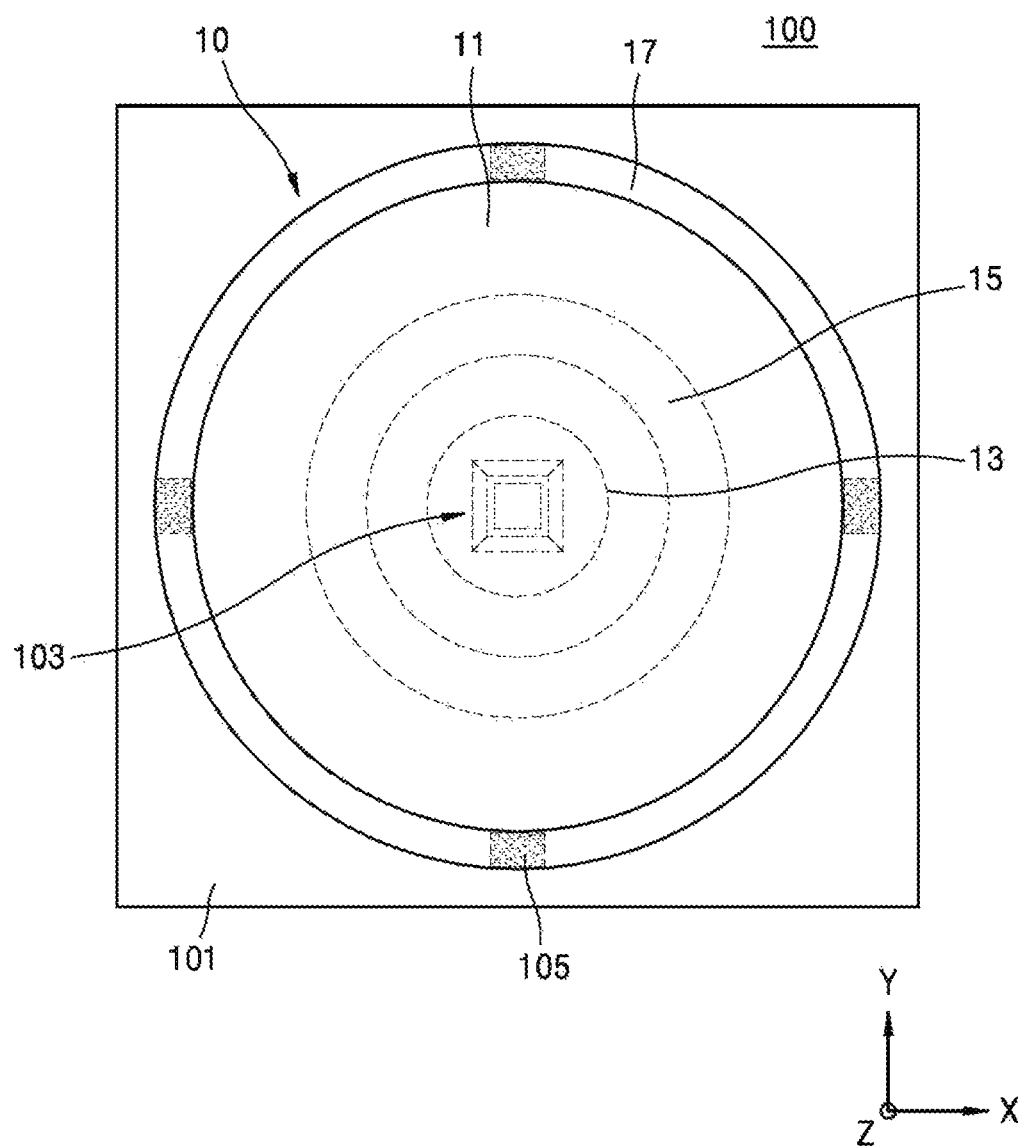
FIGS. 3A and 3B are a plan view and a side view of the LED module of FIG. 1.
Figure 3B:
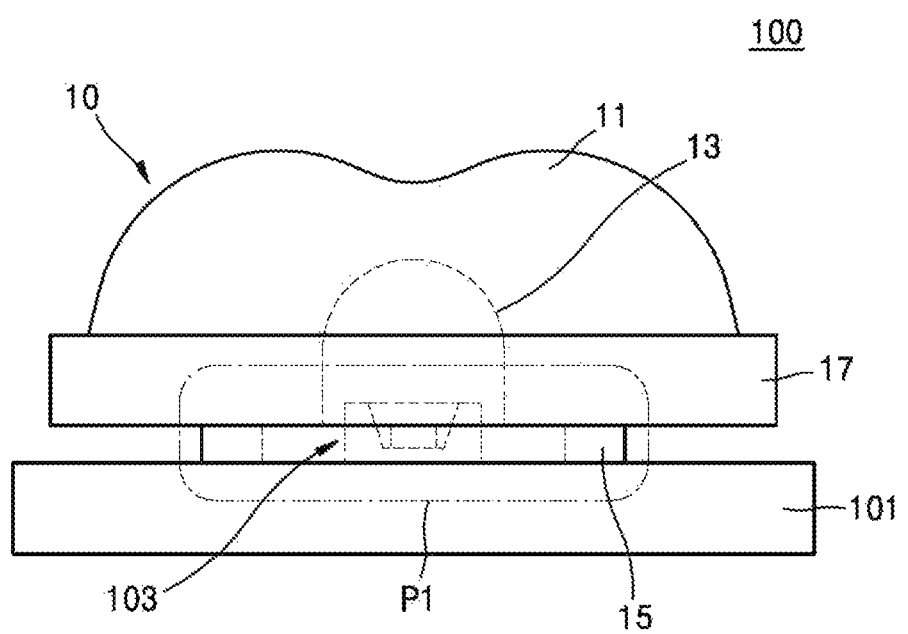
Figure 3B:
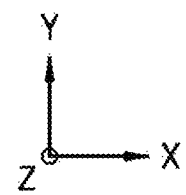
Figure 4:
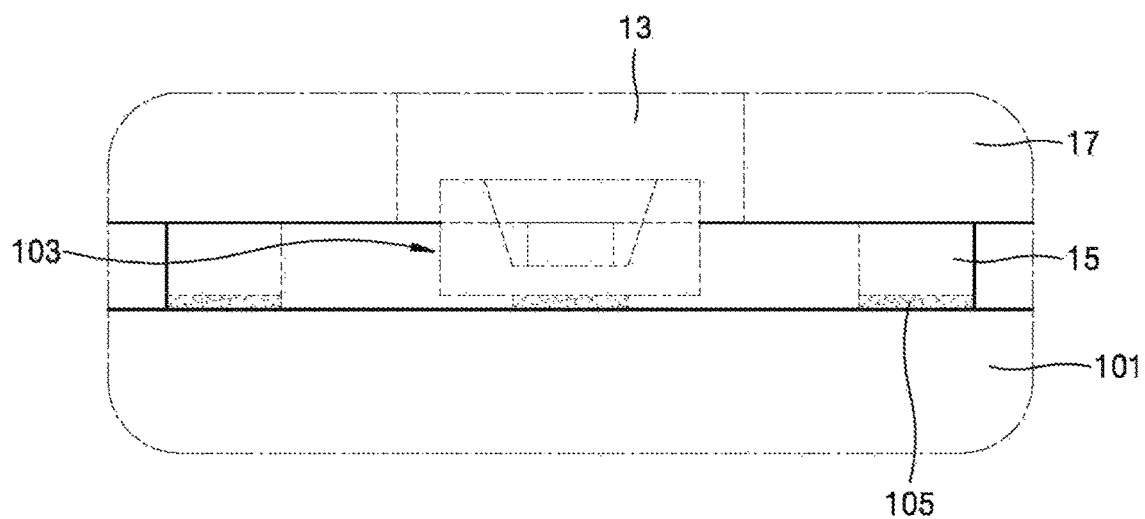
FIG. 4 is an enlarged view of a region P1 of FIG. 3B.

FIGS. 3A and 3B are a plan view and a side view of the LED module 100 of FIG. 1. FIG. 4 is an enlarged view of a region P1 of FIG. 3B.

Referring to FIGS. 1, 3A, and 3B, the optical lens 10 may be arranged on the substrate 101 so as to cover an upper side of the LED package 103 mounted on the substrate 101. In this case, the groove 13 and the supporting portion 15 of the optical lens 10 may be arranged to envelop the LED package 103.

Referring together to FIG. 4, the supporting portion 15 of the optical lens 10 may be secured to the substrate 101 via an adhesive 105. For example, the adhesive 105 may be interposed between a lower surface of the supporting portion 15 and an upper surface of the substrate 101. In this case, the adhesive 105 may be applied only to some arbitrary portions of a region, in which the supporting portion 15 and the substrate 101 face each other, on the substrate 101. Since the supporting portion 15 does not have directionality, even though the adhesive 105 is applied to any portion of the region, in which the ring-shaped supporting portion 15 and the substrate 101 face each other, on the substrate 101, the supporting portion 15 of the optical lens 10 can be bonded to the substrate 101. Although the region, in which the supporting portion 15 and the substrate 101 face each other, has a ring shape, the adhesive 105 may be applied only to four portions separated from each other in the ring-shaped facing region. In one or more exemplary embodiments, the adhesive 105 may be applied only to at least two portions of the region in which the supporting portion 15 and the substrate 101 face each other, and may be applied to the overall region in which the supporting portion 15 and the substrate 101 face each other.

In general, a supporting portion of an optical lens may be a plurality of protrusions separated from each other in the form of islands, and an area occupied by the supporting portion may be extremely small. Therefore, when an adhesive is applied to a substrate, additional alignment is needed such that a region, to which the adhesive is applied, on the substrate coincides with a region occupied by the supporting portion. That is, in addition to first alignment for aligning a center of an LED package with a center of the optical lens, second alignment for correcting a direction of the optical lens by rotating the optical lens is needed.

However, the optical lens 10 according to the present exemplary embodiment does not have directionality. Thus, even though the adhesive 105 is applied only to a portion of the region in which the supporting portion 15 and the substrate 101 face each other, the substrate 101 can be bonded to the optical lens 10, thereby improving poor bonding. In addition, since second alignment can be omitted when the optical lens 10 is mounted on the substrate 101, a productivity of the LED module can be improved.

In one or more exemplary embodiments, since the LED module 100 may be used for a direct type backlight unit, the plurality of LED packages 103 may be mounted on the substrate 101. In addition, a controller capable of storing and controlling a driving program of the LED package 103 may be mounted on the substrate 101. Details of the controller will be described below with reference to FIG. 14.

Figure 5A:
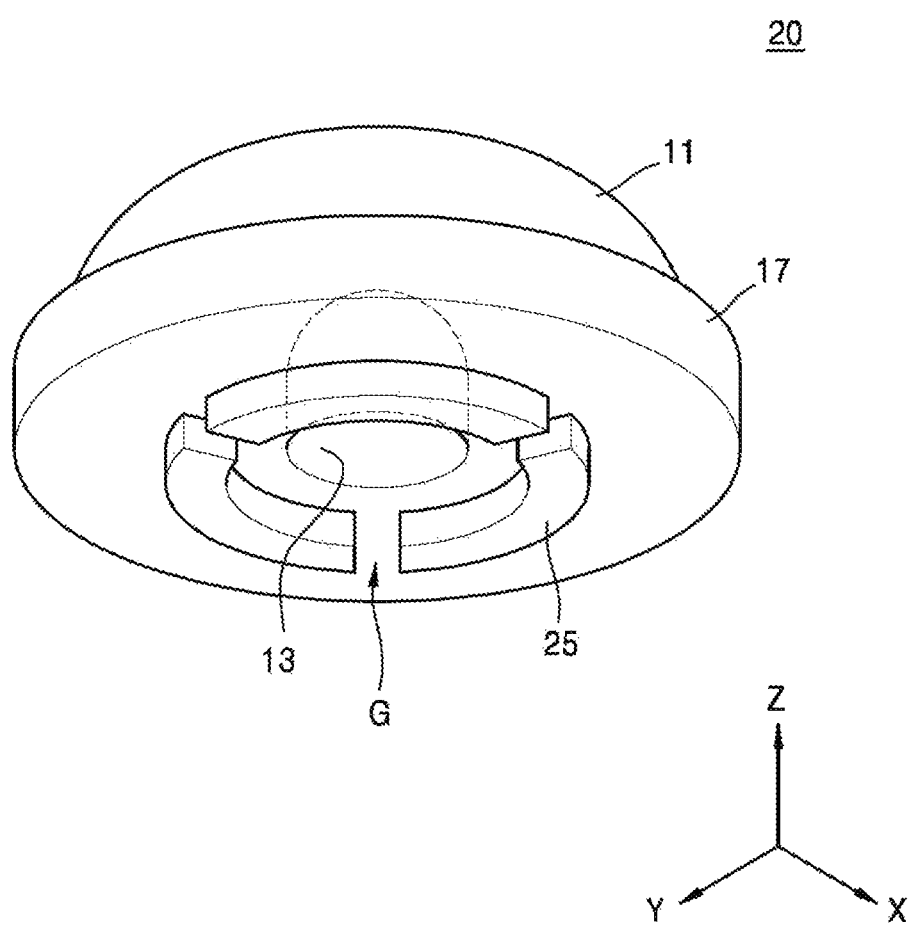
FIGS. 5A and 5B are a perspective view and a plan view of an optical lens according to exemplary embodiments.
Figure 5B:
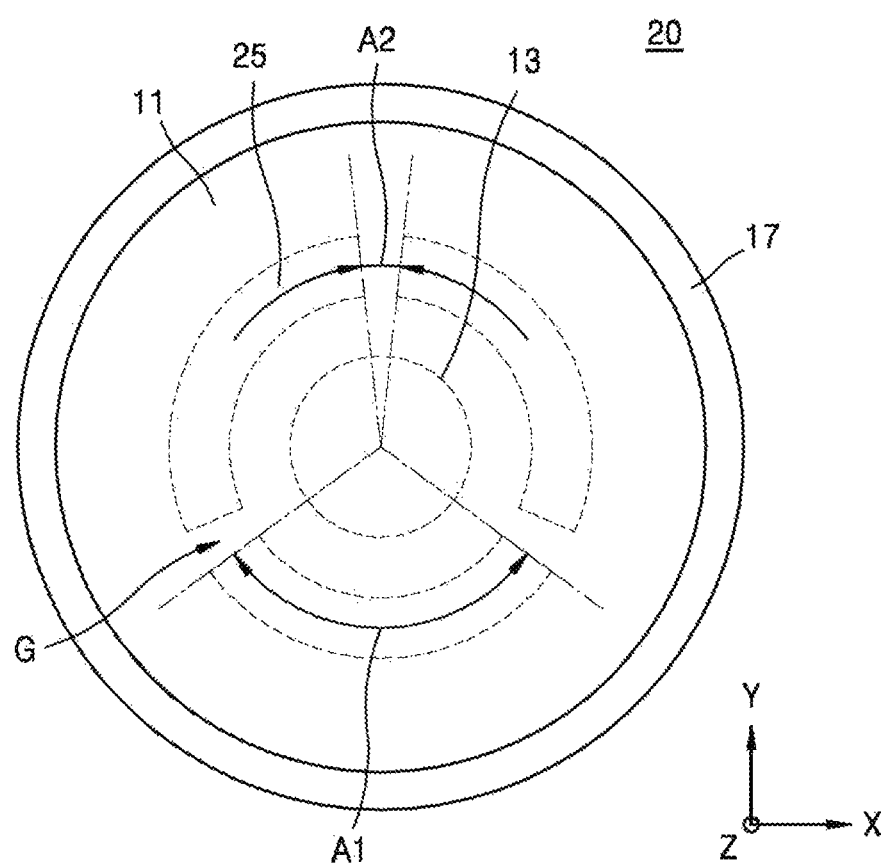

FIGS. 5A and 5B are a perspective view and a plan view of an optical lens 20 according to exemplary embodiments. While the optical lens 20 of FIGS. 5A and 5B is similar to the optical lens 10 of FIGS. 2A to 2E, the optical lens 20 differs from the optical lens 10 in a shape of a supporting portion 25.

Referring to FIGS. 5A and 5B, the supporting portion 25 of the optical lens 20 may include three arcs 25A, 25B, and 25C. Gaps G may be respectively formed among the three arcs 25A, 25B, and 25C. The gaps G may be paths for discharging heat generated due to drive of the LED package 103.

Each of the three arcs 25A, 25B, and 25C may be arranged to form a portion of an imaginary circle located at a constant distance from a center of the groove 13. For example, the three arcs 25A, 25B, and 25C included in the supporting portion 25 may be shapes obtained by dividing the supporting portion 15 of FIGS. 2A to 2E by the three gaps G. In some exemplary embodiments, the three arcs 25A, 25B, and 25C included in the supporting portion 25 may have the same length.

A length A1 of each of the three arcs 25A, 25B, and 25C of the supporting portion 25 may be larger than a length A2 of any one of the three gaps G. The length A1 of the arc and the length A2 of the gap may be measured with reference to a center of a width of the arcs 25A, 25B, and 25C. Here, the length A1 of the arc and the length A2 of the gap G are measured along the imaginary circle. For example, in the imaginary circle, an area occupied by the supporting portion 25 is larger than an area occupied by the gaps G. In one or more exemplary embodiments, the length A2 of any one of the gaps may be about 0.5 mm or less.

An adhesive may be applied to the substrate 101 in order to bond the optical lens 20 to the substrate 101. In this case, even though the adhesive is applied to some arbitrary portions of a region in which the substrate 101 and the imaginary circle face each other, the supporting portion 25 of the optical lens 20 can be bonded to the substrate 101.

In general, a supporting portion may be a plurality of protrusions separated from each other in the form of islands. Thus, an area occupied by the supporting portion may be extremely small. Therefore, when an adhesive is applied to a substrate, additional alignment is needed such that a region, to which the adhesive is applied, on the substrate coincides with a region occupied by the supporting portion. That is, in addition to first alignment for aligning a center of an LED package on the substrate with a center of an optical lens, second alignment for correcting a direction of the optical lens by rotating the optical lens is needed.

However, since the optical lens 20 according to the present exemplary embodiment does not have directionality, bonding between the substrate 101 and the optical lens 20 is stable, and second alignment can be omitted when the optical lens 20 is mounted on the substrate 101, thereby improving productivity of the LED module.

In FIGS. 5A and 5B, although the supporting portion 25 is illustrated as including the three arcs separated by the three gaps G, the inventive concept is not limited thereto. In one or more exemplary embodiments, the supporting portion 25 may include at least two gaps G, and at least two arcs separated by the at least two gaps G. In one or more exemplary embodiments, a length of each of the at least two arcs may be larger than lengths of the gaps measured along the imaginary circle. In one or more exemplary embodiments, if the supporting portion includes at least two arcs, each of the at least two arcs may have the same length. In one or more exemplary embodiments, the supporting portion 25 may include one gap G. In one or more exemplary embodiments, the supporting portion 25 may include twelve gaps G and twelve arcs.

The optical lens 20 of FIGS. 5A and 5B may replace the optical lens 10 of the LED module 100 described with reference to FIGS. 1, 3A, and 3B.

Referring together to FIGS. 1, 3A, and 3B, the supporting portion 25 of the optical lens 20 may be secured to the substrate 101 via the adhesive 105. For example, the adhesive 105 may be interposed between a lower surface of the supporting portion 25 and the upper surface of the substrate 101. In this case, the adhesive 105 may be applied only to some arbitrary portions of a region, in which the supporting portion 25 and the substrate 101 face each other, on the substrate 101.

The supporting portion 25 includes the gaps G among the three arcs 25A, 25B, and 25C is not similar to the supporting portion 15 of FIGS. 1, 3A, and 3B. However, the lengths A2 of the gaps may be much less than the lengths A1 of the three arcs 25A, 25B, and 25C. Thus, even though the adhesive 105 is applied to any portion of the region in which the substrate 101 and the imaginary circle including the three arcs 25A, 25B, and 25C of the supporting portion 25 face each other, it can be ensured that the supporting portion 25 is bonded to the substrate 101. In one or more exemplary embodiments, the length of the gap may be ½₀ times a circumference of the imaginary circle including the three arcs 25A, 25B, and 25C. The circumference of the imaginary circle may be measured with reference to the center of the width of the arcs 25A, 25B, and 25C.

Figure 6A:
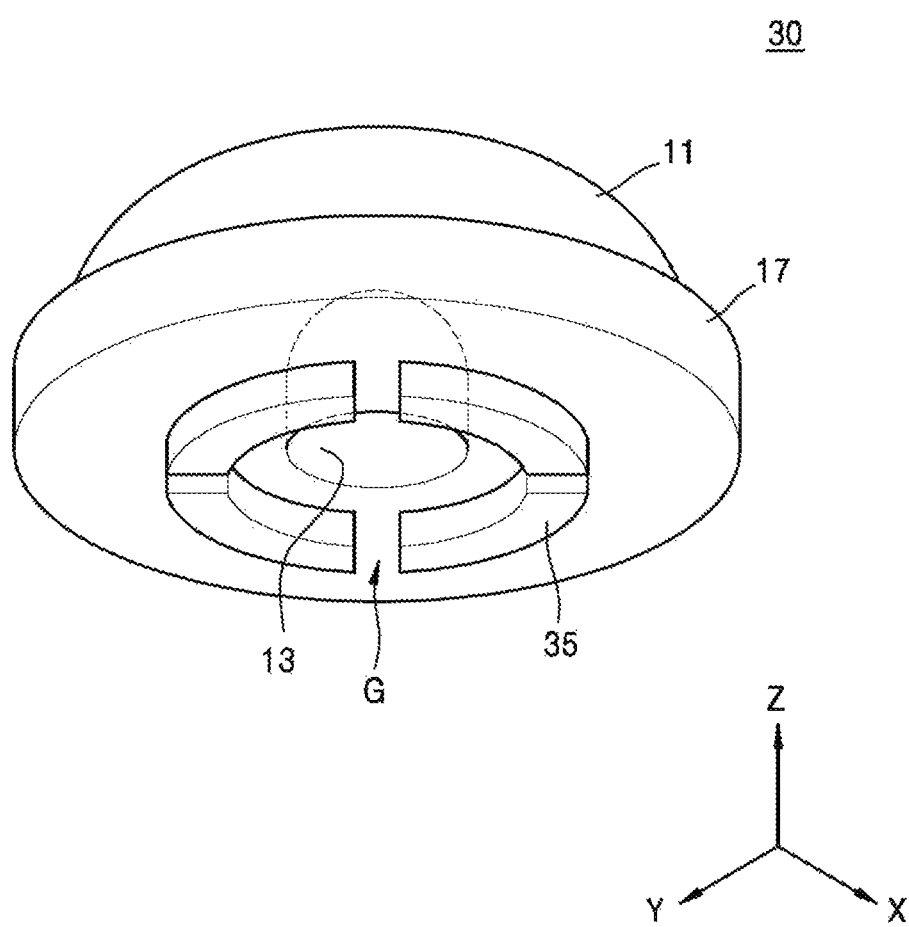
FIGS. 6A and 6B are a perspective view and a plan view of an optical lens according to exemplary embodiments.
Figure 6B:
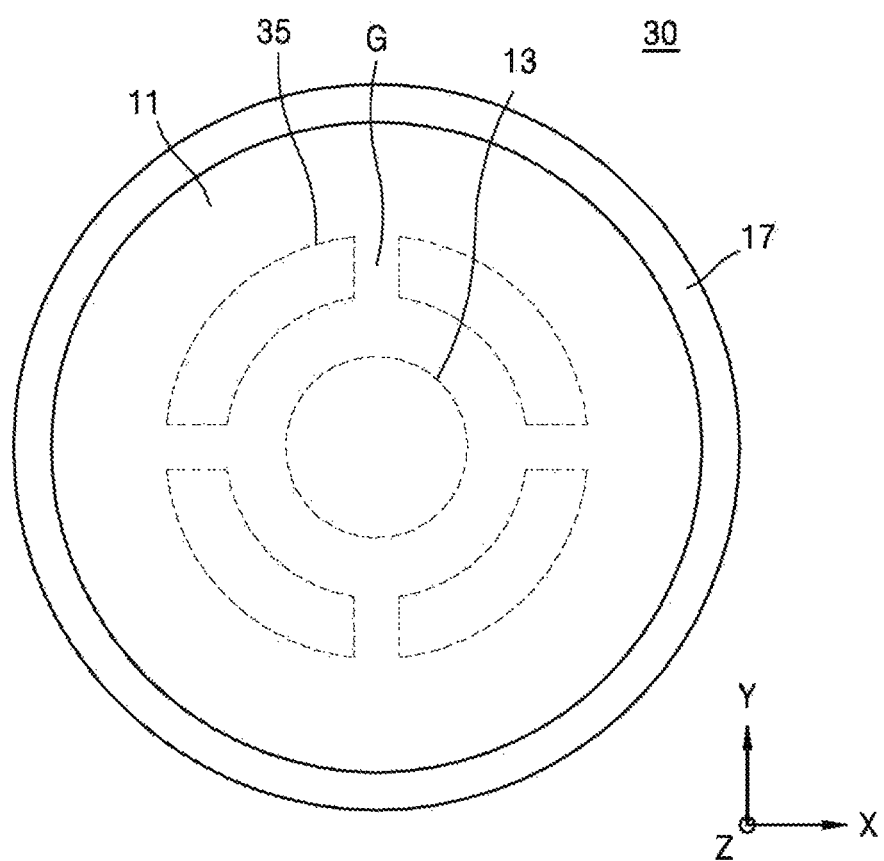

FIGS. 6A and 6B are a perspective view and a plan view of an optical lens 30 according to exemplary embodiments. While the optical lens 30 of FIGS. 6A and 6B is similar to the optical lens 10 of FIGS. 2A to 2E, the optical lens 30 differs from the optical lens 10 in that a ring-shaped supporting portion 35 of the optical lens 30 includes four gaps G and four arcs separated by the gaps G.

The optical lens 30 of FIGS. 6A and 6B may replace the optical lens 10 of the LED module 100 described with reference to FIGS. 1, 3A, and 3B.

Figure 7:
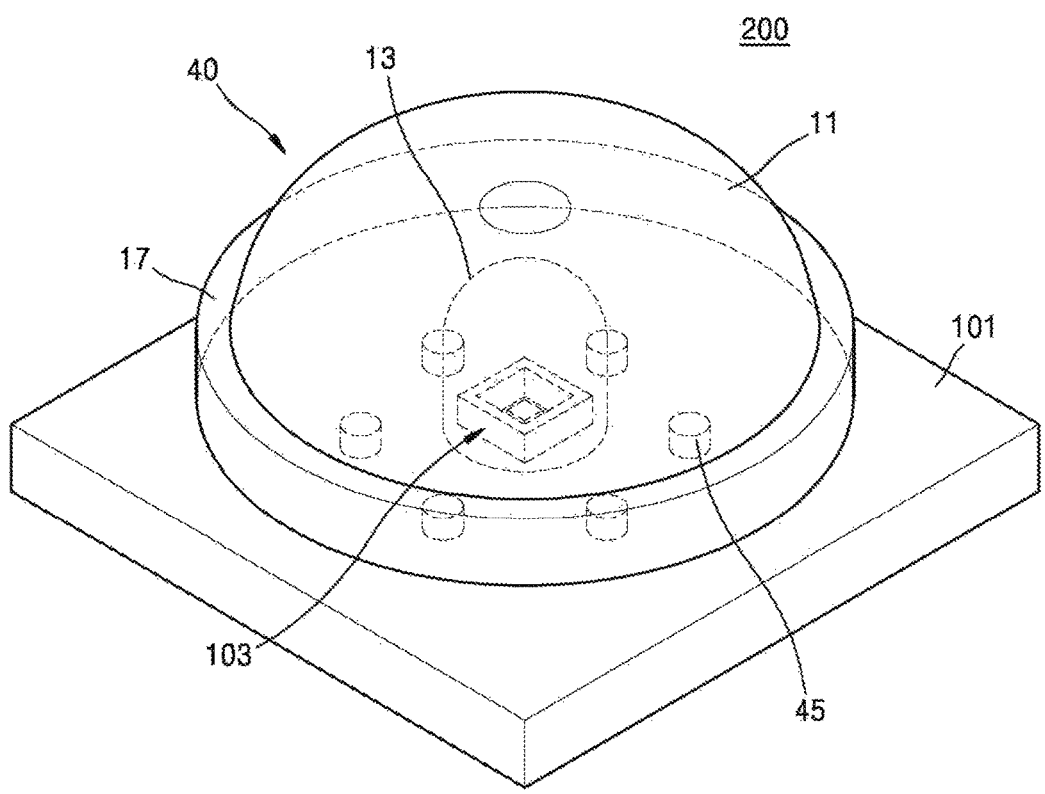
FIG. 7 is a perspective view of an LED module including an optical lens according to exemplary embodiment.

FIG. 7 is a perspective view of an LED module 200 including an optical lens 40 according to an exemplary embodiment. While the LED module 200 of FIG. 7 is similar to the LED module 100 of FIG. 1, the LED module 200 differs from the LED module 100 in a shape of a supporting portion 45.

Referring to FIG. 7, the LED module 200 may include an LED package 103 mounted on a substrate 101 and an optical lens 40 arranged on an upper side of the LED package 103. The optical lens 40 may include a body 11 and a plurality of supporting portions 45.

The body 11 may have a groove 13 receiving the LED package 103 therein, and have a dome-shaped upper surface. The plurality of supporting portions 45 protrudes from a lower surface of the body 11 at a constant distance from a center of the groove 13. Here, adjoining supporting portions 45 among the plurality of supporting portions 45 may be offset from each other by 60 degrees or less along an imaginary circle including the plurality of supporting portions 45 as portions thereof.

The substrate 101 may be a printed circuit board (PCB). The LED package 103 may have a structure in which a light emitting chip is arranged in a cup-structured package body, and the LED package 103 is arranged on the substrate 101. The optical lens 40 may be arranged on the upper side of the LED package 103 for improvement in an optical efficiency of the LED package 103. The optical lens 40 will be described in detail with reference to FIGS. 8A to 8D.

Figure 8A:
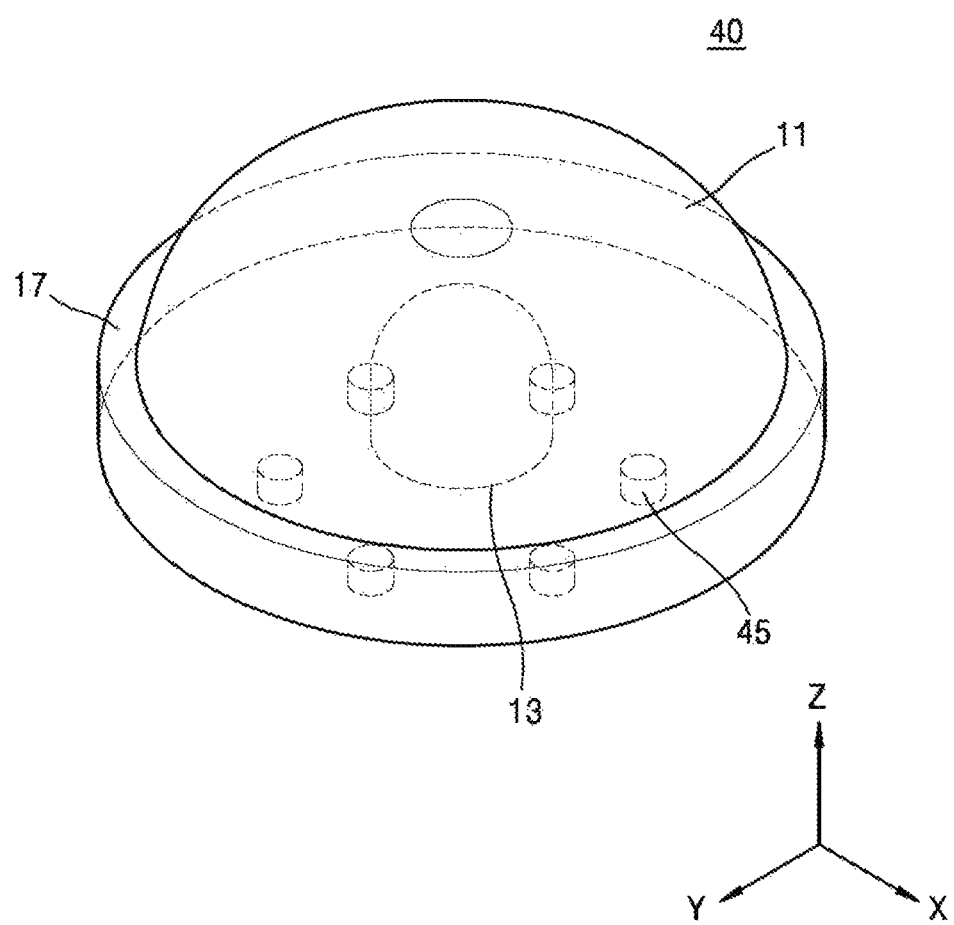
FIGS. 8A to 8D are perspective views, a plan view, and a side view of an optical lens included in the LED module of FIG. 7.
Figure 8B:
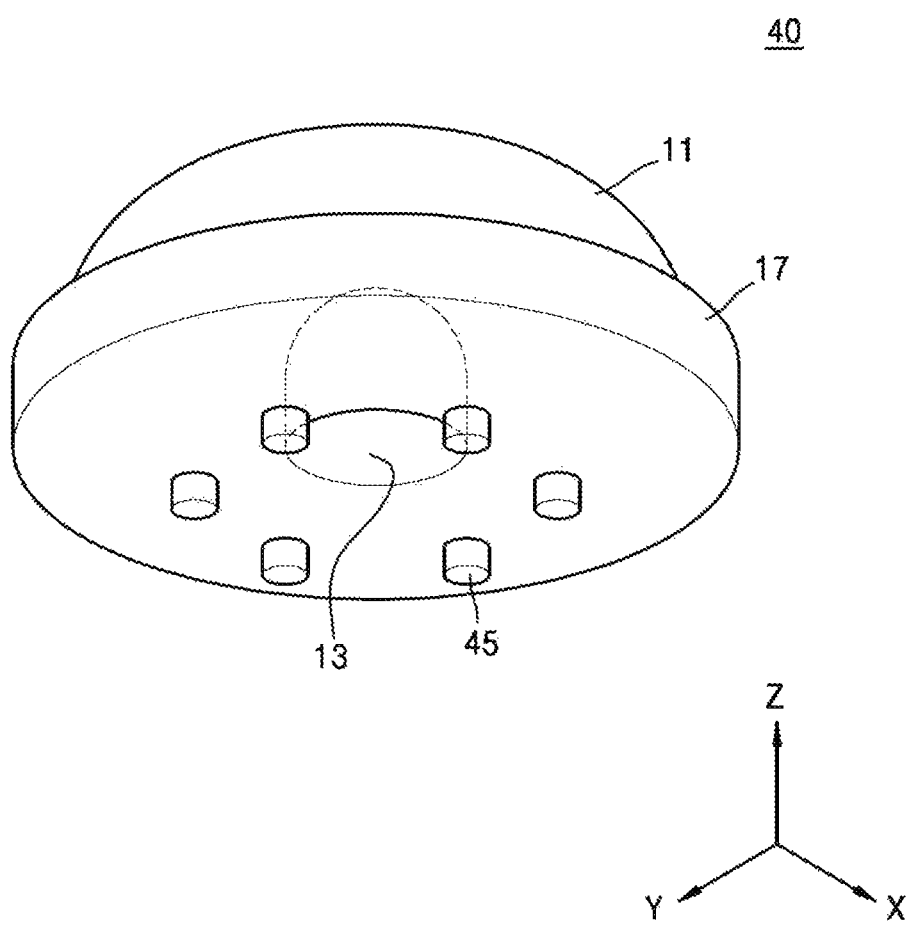
Figure 8C:
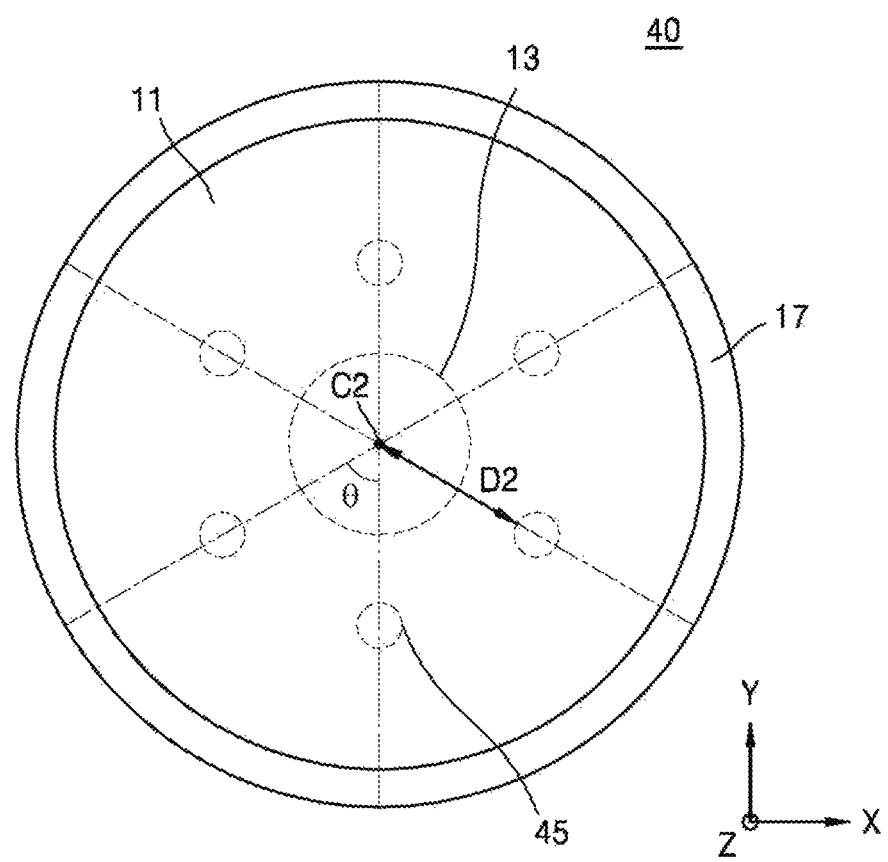
Figure 8D:
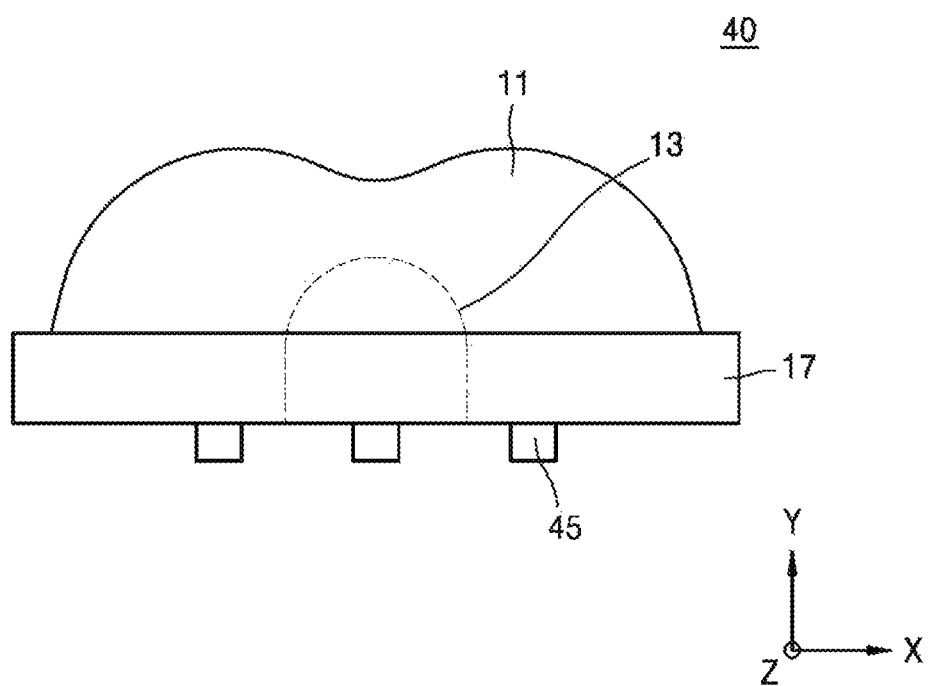

FIGS. 8A to 8D show the optical lens 40 included in the LED module 200 of FIG. 7. FIG. 8A is a perspective view showing the optical lens 40 from an upper side thereof. FIG. 8B is a perspective view showing the optical lens 40 from a lower side thereof. FIG. 8C is a plan view of the optical lens 40. FIG. 8D is a side view of the optical lens 40.

Referring to FIGS. 8A to 8D, the optical lens 40 may include the body 11 and the plurality of supporting portions 45. In addition, the optical lens 40 may further include a sidewall 17 along an edge of the body 11.

The body 11 may have the groove 13 receiving the LED package 103 therein. The body 11 may have the dome-shaped upper surface.

The plurality of supporting portions 45 may protrude from the lower surface of the body 11 at a constant distance D2 from a center C2 of the groove 13 (see FIG. 8C). Here, the adjoining supporting portions 45 among the plurality of supporting portions 45 may be offset from each other by 60 degrees or less along the imaginary circle including the plurality of supporting portions 45 as portions thereof.

In one or more exemplary embodiments, the adjoining supporting portions 45 among the plurality of supporting portions 45 may be offset from each other by a constant angle θ along the imaginary circle. In one or more exemplary embodiments, the optical lens 40 may include six supporting portions 45 protruding from the lower surface of the body 11. In this case, the six supporting portions 45 may be arranged such that the adjoining supporting portions 45 are separated by 60 degrees.

Figure 9A:
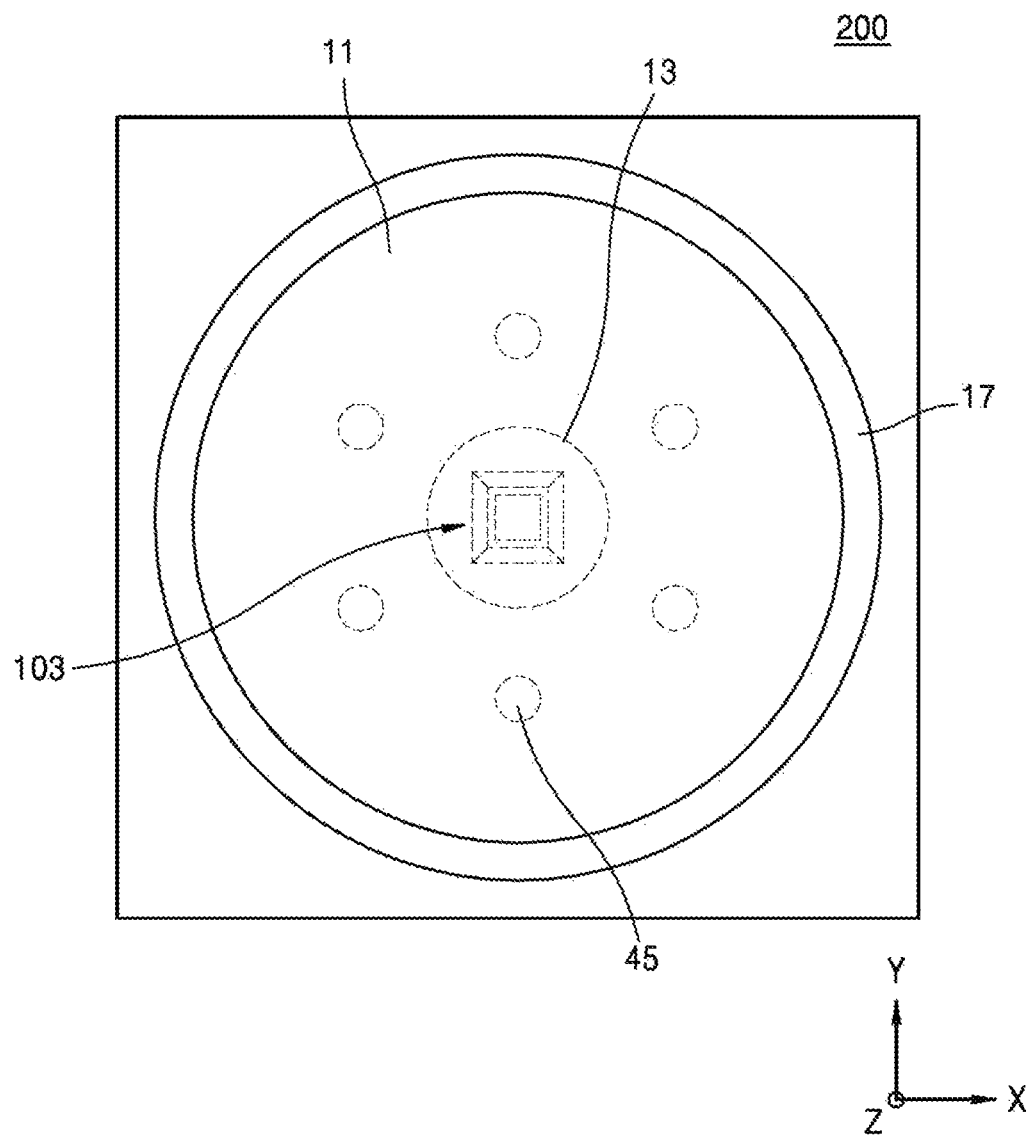
FIGS. 9A and 9B are a plan view and a sectional view of the LED module of FIG. 7.
Figure 9B:
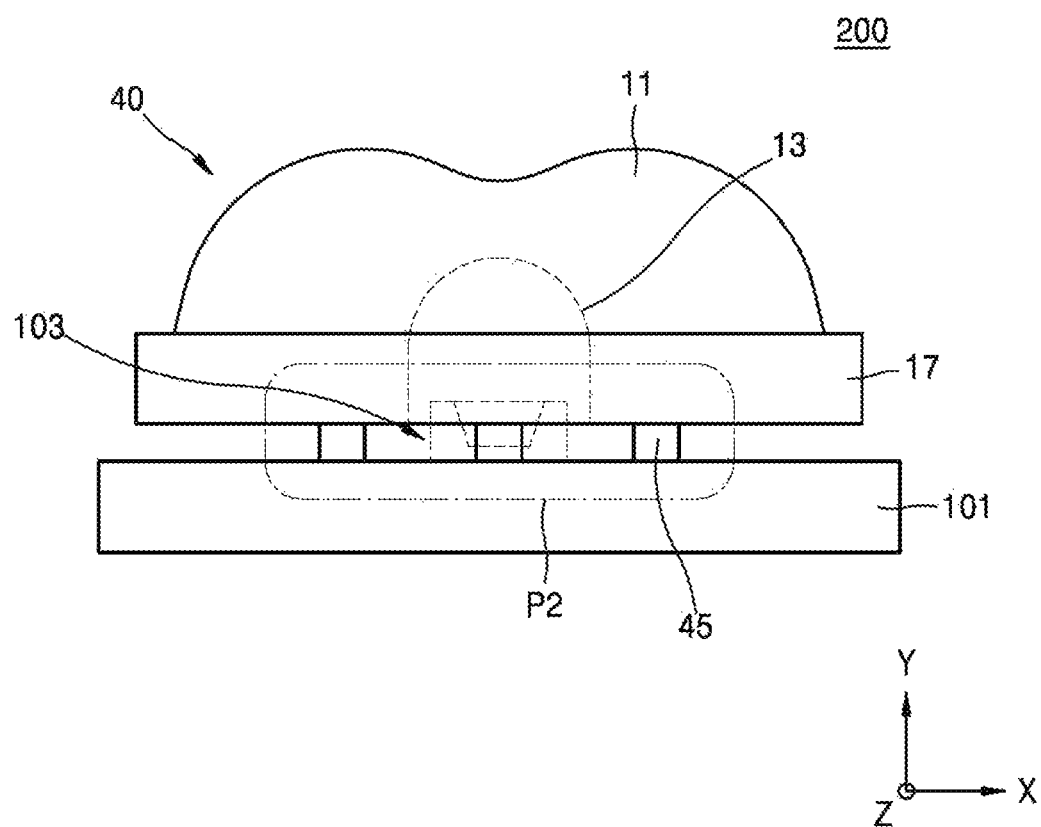
Figure 10:
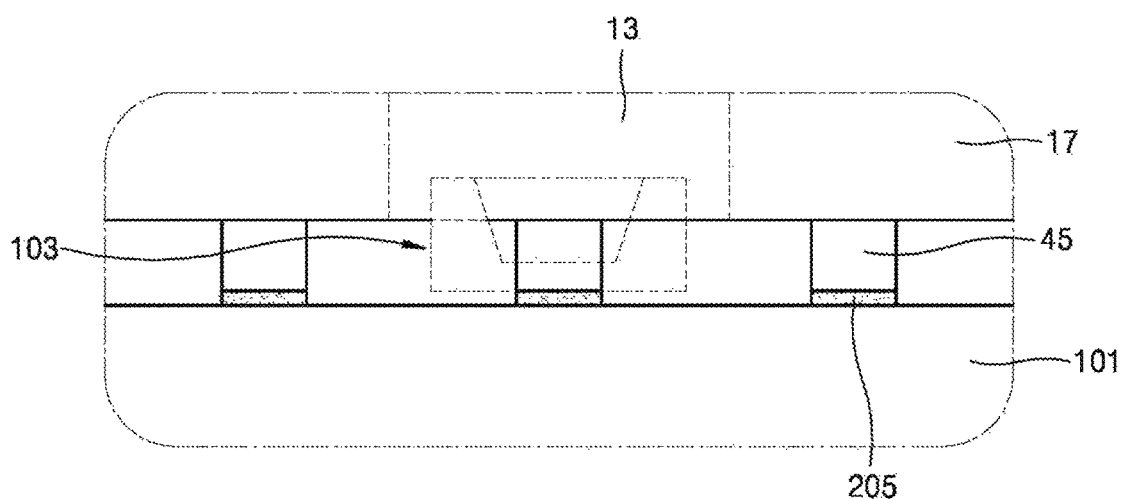
FIG. 10 is an enlarged view of a region P2 of FIG. 9B.

FIGS. 9A and 9B are a plan view and a sectional view of the LED module 200 of FIG. 7. FIG. 10 is an enlarged view of a region P2 of FIG. 9B.

Referring to FIGS. 7, 9A, and 9B, the optical lens 40 may be arranged on the substrate 101 so as to cover the upper side of the LED package 103 mounted on the substrate 101. In this case, the groove 13 and the plurality of supporting portions 45 of the optical lens 40 may be arranged to envelop the LED package 103.

Referring together to FIG. 10, since the plurality of supporting portions 45 are formed to be separated from each other, an area of a region in which the plurality of supporting portions 45 and the substrate 101 face each other may be extremely small. Thus, when an adhesive for bonding the plurality of supporting portions 45 to the substrate 101 is formed on the substrate 101, an additional alignment may be needed such that the plurality of supporting portions 45 coincide with locations, to which the adhesive is applied, on the substrate 101. That is, in addition to first alignment for aligning a center of the LED package 103 with a center of the optical lens 40, second alignment for correcting a direction of the optical lens 40 may be needed.

In the optical lens 40 according to the present exemplary embodiment, since the adjoining supporting portions 45 are separated by 60 degrees or less, a rotation angle for direction correction may be within a range of ±30 degree. Thus, since a rotation angle of a mounter for lens mounting, which performs direction correction, can be reduced, precision of optical lens mounting can be improved.

In FIGS. 7 and 10, although the adhesive 105 is used to secure the plurality of supporting portions 45 to the substrate 101, the inventive concept is not limited thereto. The plurality of supporting portions 45 may be secured to the substrate 101 in a manner of fastening the plurality of supporting portions 45 to grooves formed on the substrate 101.

Figure 11A:
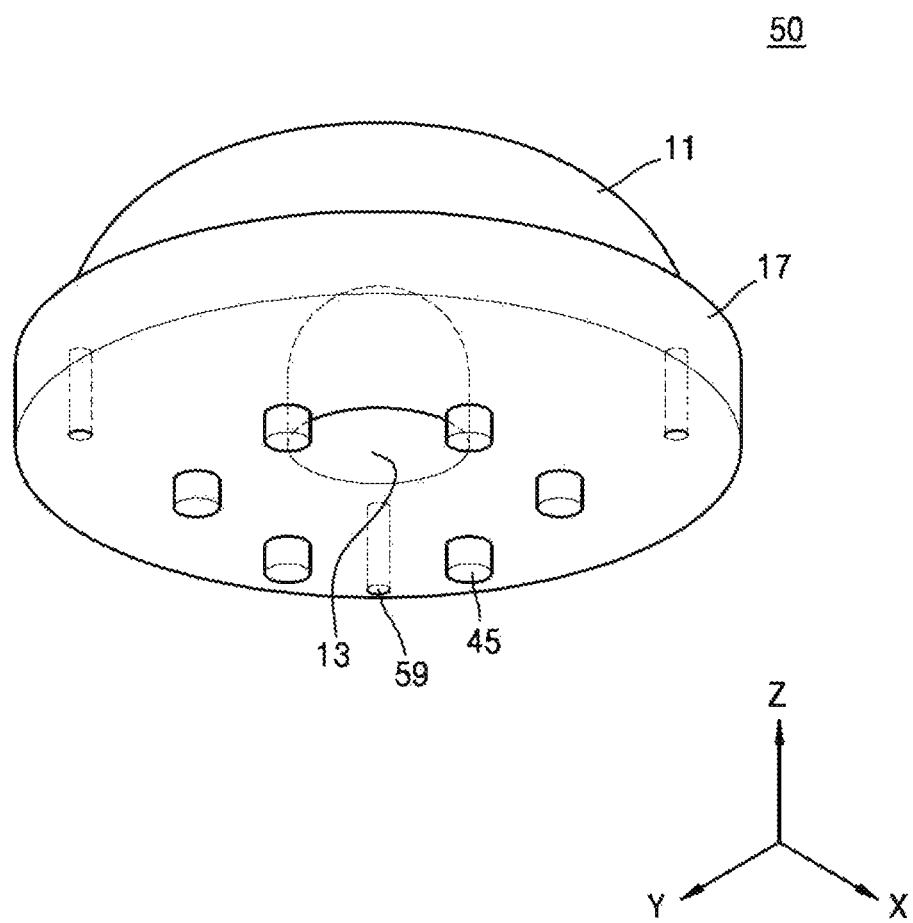
FIGS. 11A to 11C are a perspective view, a plan view, and a side view of an optical lens according to exemplary embodiments t.
Figure 11B:
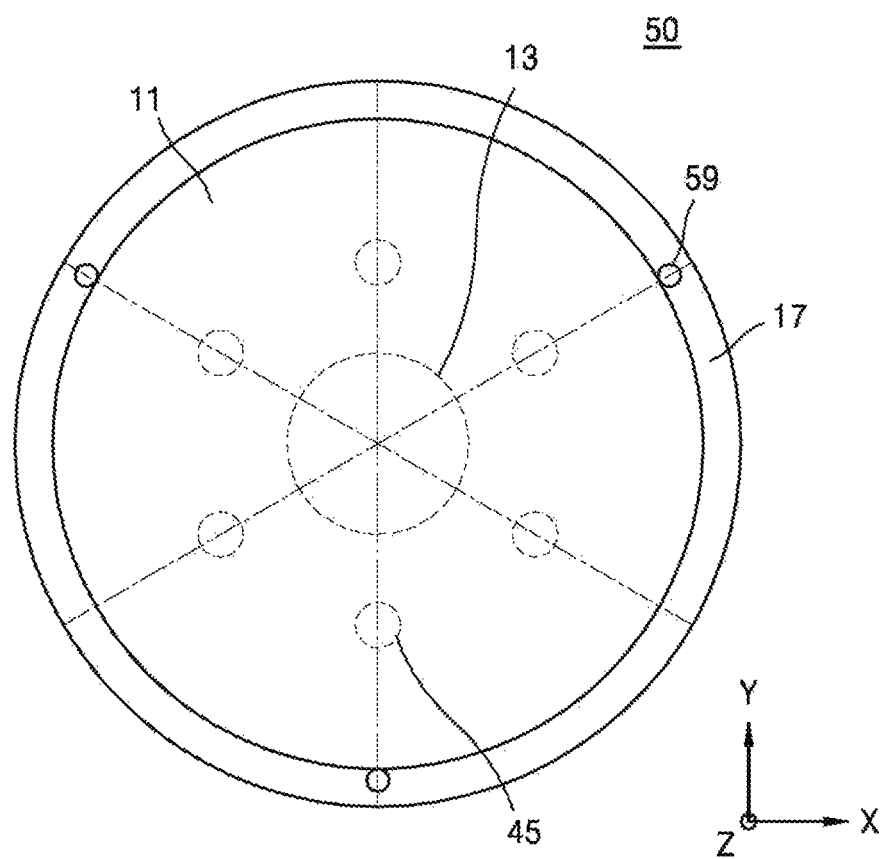
Figure 11C:
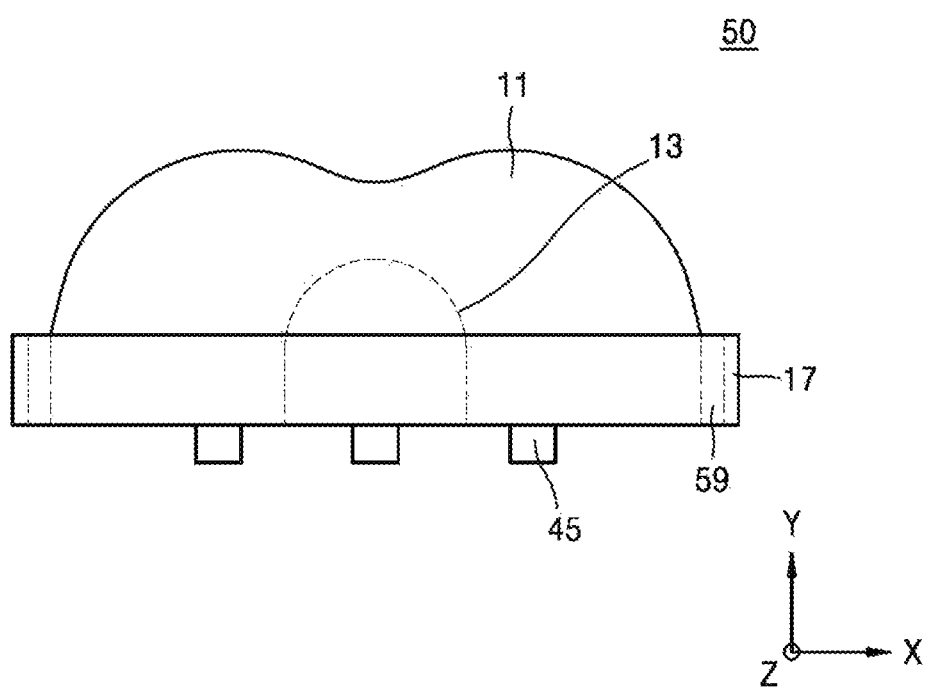

FIGS. 11A to 11C show an optical lens 50 according to exemplary embodiments. FIG. 11A is a perspective view showing the optical lens 50 from a lower side thereof. FIG. 11B is a plan view of the optical lens 50. FIG. 11C is a side view of the optical lens 50. While the optical lens 50 of FIGS. 11A and 11C is similar to the optical lens 40 of FIGS. 8A to 8D, the optical lens 50 differs from the optical lens 40 in that alignment marks 59 are formed on a sidewall 17 of the optical lens 50.

Referring to FIGS. 11A to 11C, the optical lens 50 may include a body 11 and a plurality of supporting portions 45. In addition, the optical lens 50 may further include the sidewall 17 along an edge of the body 11.

The body 11 may include a groove 13 therein, and have a dome-shaped upper surface. Here, a central portion of the upper surface of the body 11 may have a recessed shape. The recessed shape may be for more efficiently emitting light generated from an LED package 103.

As described above with reference to FIGS. 9A and 9B, the plurality of supporting portions 45 may protrude from a lower surface of the body 11 and be separated from each other.

The sidewall 17 may include at least three alignment marks 59 arranged at a constant distance from a center of the groove 13. In one or more exemplary embodiments, the alignment marks 59 may be holes penetrating through the sidewall 17.

The alignment marks 59 may be used when additional alignment is performed such that the plurality of supporting portions 45 coincide with locations, to which an adhesive is applied, on the substrate 101.

In general, when an optical lens 50 is arranged on the substrate 101, the optical lens 50 is aligned such that the center of the groove 13 of the optical lens 50 coincides with a center of the LED package 103 mounted on the substrate 101. After the optical lens 50 is mounted on the substrate 101, inspection is performed as to if the center of the LED package 103 coincides with a center of a curved upper surface of the optical lens 50 instead of the center of the groove 13 of the optical lens 50. Thus, since a criterion for confirming alignment is changed before and after the optical lens 50 is mounted, there can be a problem in reliability of inspection.

However, in the optical lens 50 according to the present exemplary embodiment, since alignment can be confirmed by the same criterion using the at least three alignment marks 59 on the sidewall 17 before and after the optical lens 50 is mounted, reliability of inspection can be secured.

The optical lens 50 of FIGS. 11A to 11C may replace the optical lens 40 of the LED module 200 described with reference to FIGS. 7, 9A, and 9B.

Figure 12:
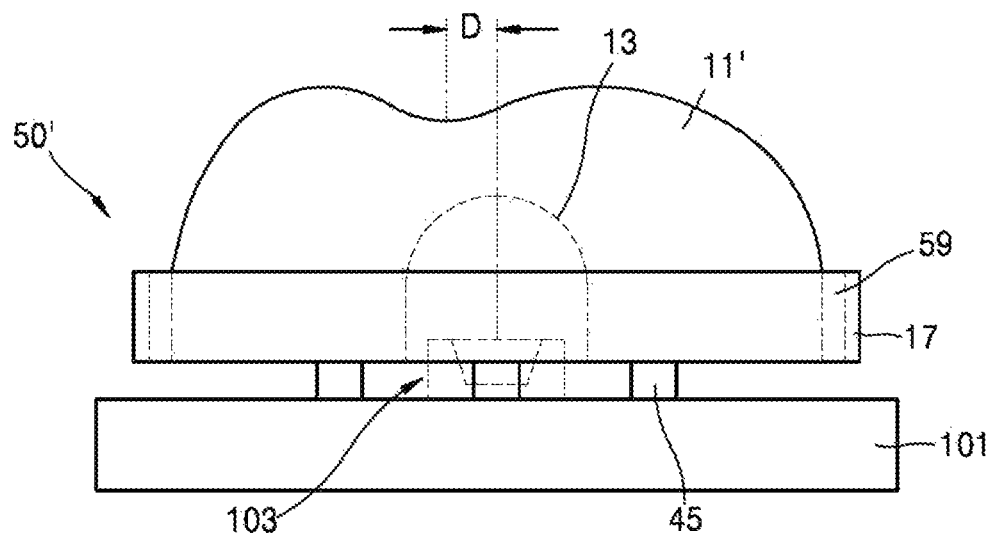
FIG. 12 is a side view of an LED module including an optical lens according to exemplary embodiment.

FIG. 12 is a side view of an LED module 200' including an optical lens 50' according to an exemplary embodiment.

Referring to FIG. 12, a body 11' of the optical lens 50' may include a groove 13 therein, and an upper surface of the body 11' may have a dome shape including a recessed portion. Here, the body 11' of the optical lens 50' may have an error D between a center of the groove 13 and a center of the recessed portion of the upper surface of the body 11'.

In this case, since a general optical lens does not comprise alignment mark 59, there can be a problem in confirming alignment between the general optical lens and the LED package 103. Thus, even though alignment is performed such that the center of the groove 13 coincides with the center of the LED package 103, an inspection result in subsequent alignment inspection may be determined as misalignment since the center of the recessed portion of the upper surface of the body 11' does not coincide with the center of the LED package 103.

However, in the optical lens 50' according to the present exemplary embodiment, since alignment can be confirmed by the same criterion using the at least three alignment marks 59 on the sidewall 17 before and after the optical lens 50' is mounted, reliability of inspection can be secured.

Figure 13A:
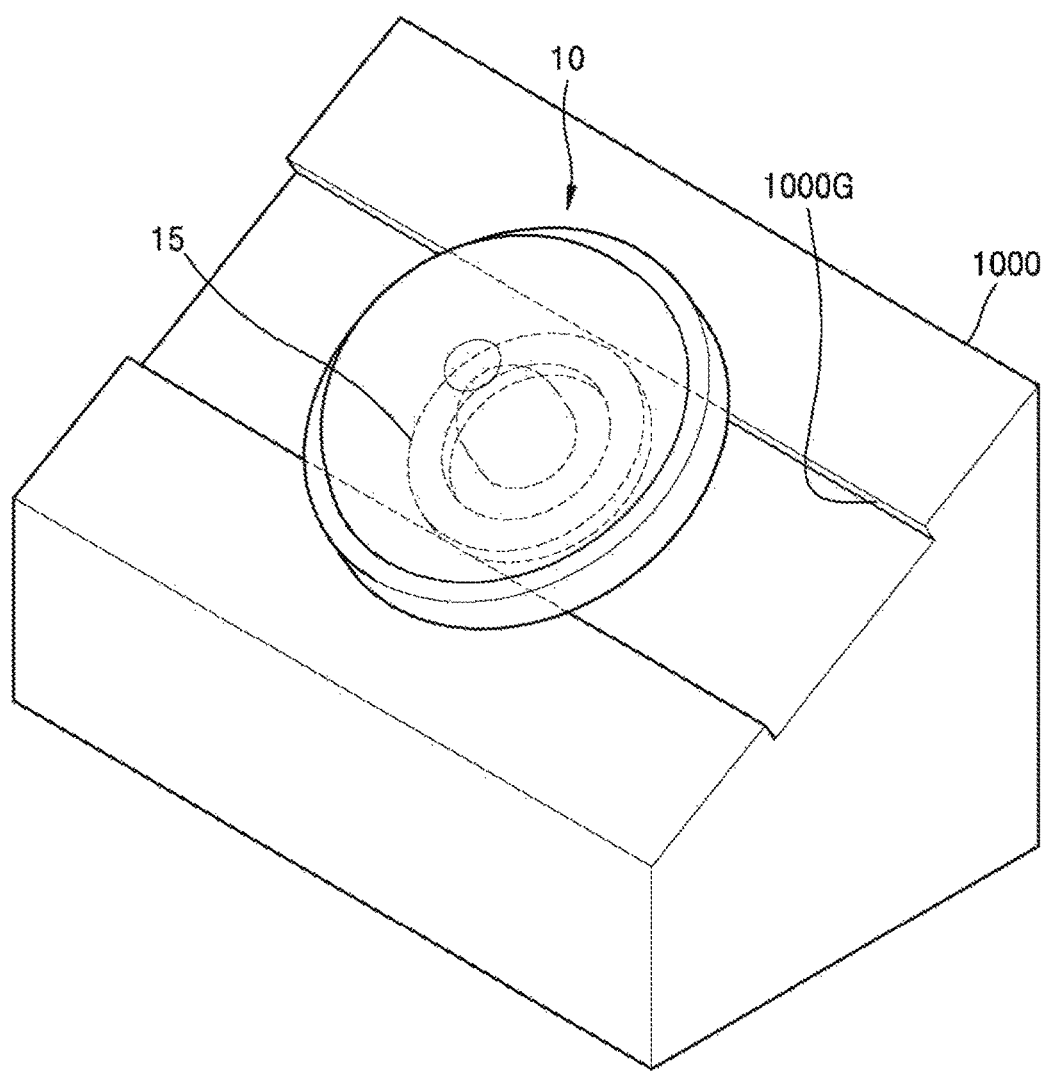
FIGS. 13A and 13B are a perspective view and a sectional view of a bulk feeder transporting an optical lens according to exemplary embodiments.
Figure 13B:
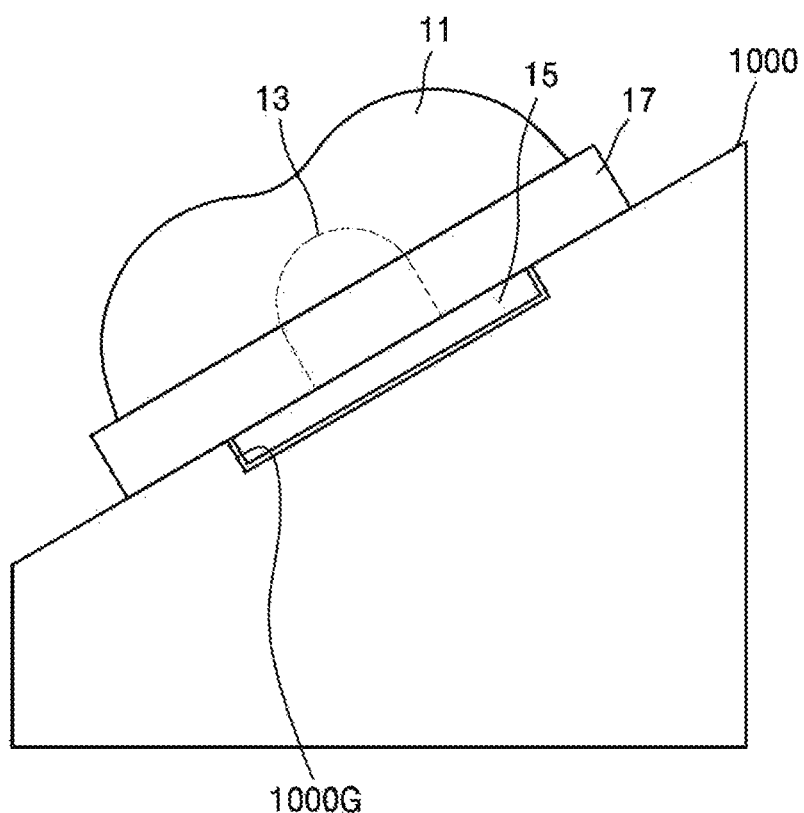

FIGS. 13A and 13B are a perspective view and a sectional view of a bulk feeder transporting an optical lens according to exemplary embodiments.

Referring to FIGS. 13A and 13B, the optical lens 10 transported on a bulk feeder 1000 is illustrated. An upper surface of the bulk feeder 100 may be formed to be inclined, without being limited thereto.

A groove 1000G may be formed on the upper surface of the bulk feeder 1000 so as to engage with the uneven structure of the supporting portion 15 of the optical lens 10. The supporting portion 15 of the optical lens 10 may be fastened to the groove 1000G of the bulk feeder 1000. Thus, the optical lens 10 on the bulk feeder 1000 can be stably transported, and the optical lens 10 can be aligned on the bulk feeder 1000.

In FIGS. 13A and 13B, while the optical lens 10 described with reference to FIGS. 2A to 2E is illustrated as being aligned on the bulk feeder 1000, the optical lenses 20 or 30 described with reference to FIGS. 5A to 6B may be aligned on the bulk feeder 1000.

Figure 14:
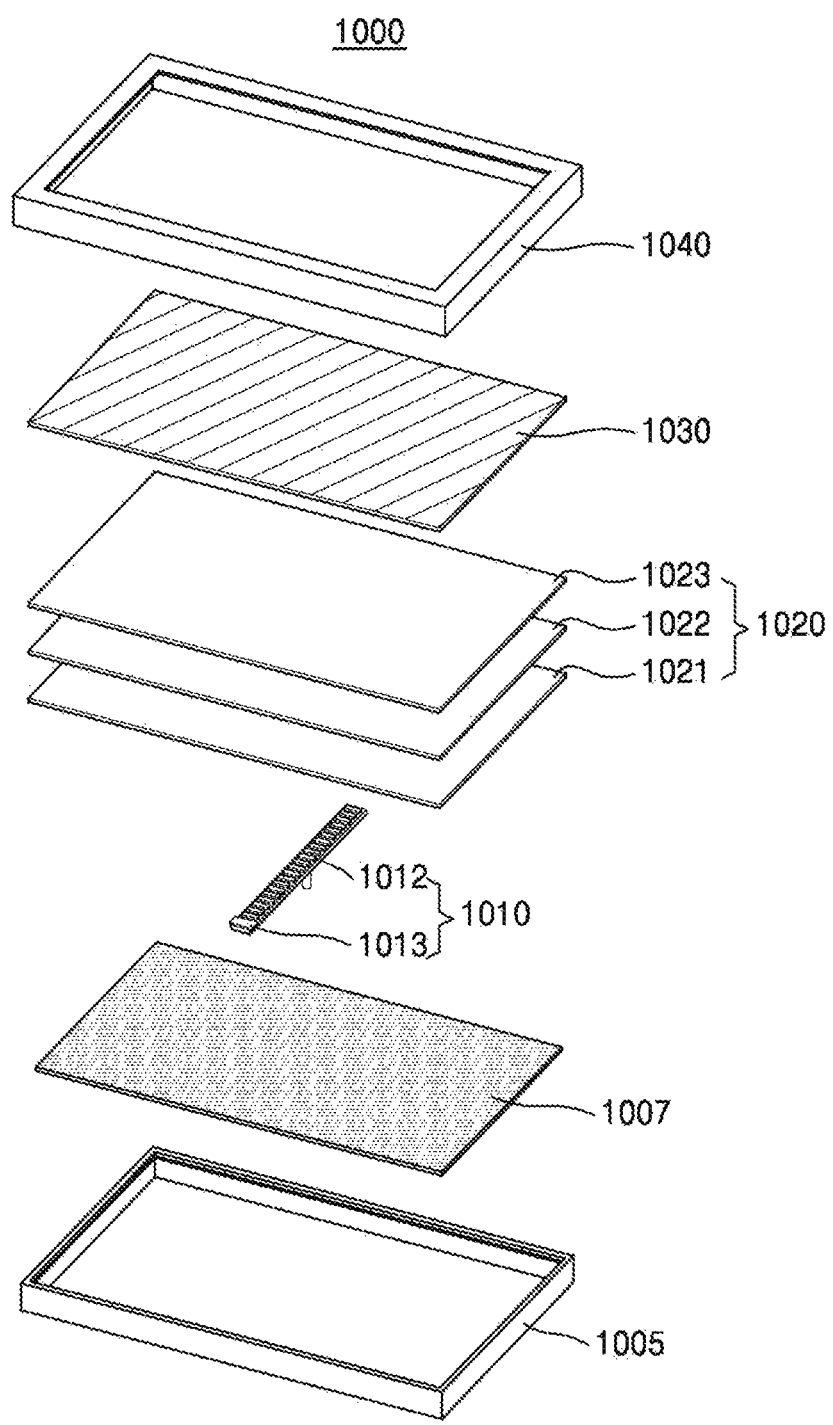
FIG. 14 is an exploded perspective view of a backlight assembly including an LED module according to exemplary embodiment.

FIG. 14 is an exploded perspective view of a backlight assembly including an LED module according to an exemplary embodiment.

Referring to FIG. 14, a direct type backlight assembly 1000 may include a lower cover 1005, a reflective sheet 1007, an LED module 1010, an optical sheet 1020, a liquid crystal panel 1030, and an upper cover 1040.

The LED module 1010 may include an LED array 1012, which includes one or more LEDs and a circuit board, and/or a controller 1013 (e.g., a rank storage portion, a driving IC, and the like). The LED module 1010 may include the LED modules 100, 200, 200' described with reference to FIGS. 1, 7, and 12. In addition, the LED module 1010 may include at least one of the optical lenses 10, 20, 30, 40, 50, 50' described with reference to FIGS. 2A to 2E, 5A to 6B, 8A to 8D, and 11A to 11C.

The controller 1013 may store and control driving information of each of the LEDs included in the LED array 1012 and/or driving program (IC) capable of controlling on/off or brightness of the LEDs individually or in groups. The LED array 1012 may receive power for emitting light and information for drive from an LED driving unit external to the direct type backlight assembly 1000. In addition, the controller 1013 may sense the driving information from the LED driving unit, and control a current or the like supplied to each of the LEDs based on the sensed driving information.

The optical sheet 1020 is arranged on an upper side of the LED module 1010, and may include a diffusion sheet 1021, a condensing sheet 1022, and a protective sheet 1023. For example, on the upper side of the LED module 1010, the diffusion sheet 1021 diffusing light emitted from the LED module 1010, the condensing sheet 1022 collecting the light diffused from the diffusion sheet 1021 to improve brightness, and the protective sheet 1023 protecting the condensing sheet 1022 and securing a viewing angle may be arranged. The upper cover 1040 may put a rim around the optical sheet 1020, and may be assembled with and fastened to the lower cover 1005. The direct type backlight assembly 1000 may further include a liquid crystal panel 1030 between the optical sheet 1020 and the upper cover 1040.

The liquid crystal panel 1030 may include a pair of a first substrate (not shown) and a second substrate (not shown), which are bonded to each other with a liquid crystal layer interposed therebetween. Pixel regions are defined on the first substrate by intersecting a plurality of gate lines with a plurality of data lines. In addition, a thin film transistor (TFT) is arranged in each of the pixel regions which correspond to the intersection points, and the TFT is connected in a one-to-one correspondence manner to a pixel electrode mounted in each of the pixel regions. The second substrate may include color filters of R, G and B colors, which correspond to each of the pixel regions, and a black matrix blocking an edge of each of the color filters as well as blocking the gate lines, the data lines, the thin film transistors, and the like.

Figure 15:
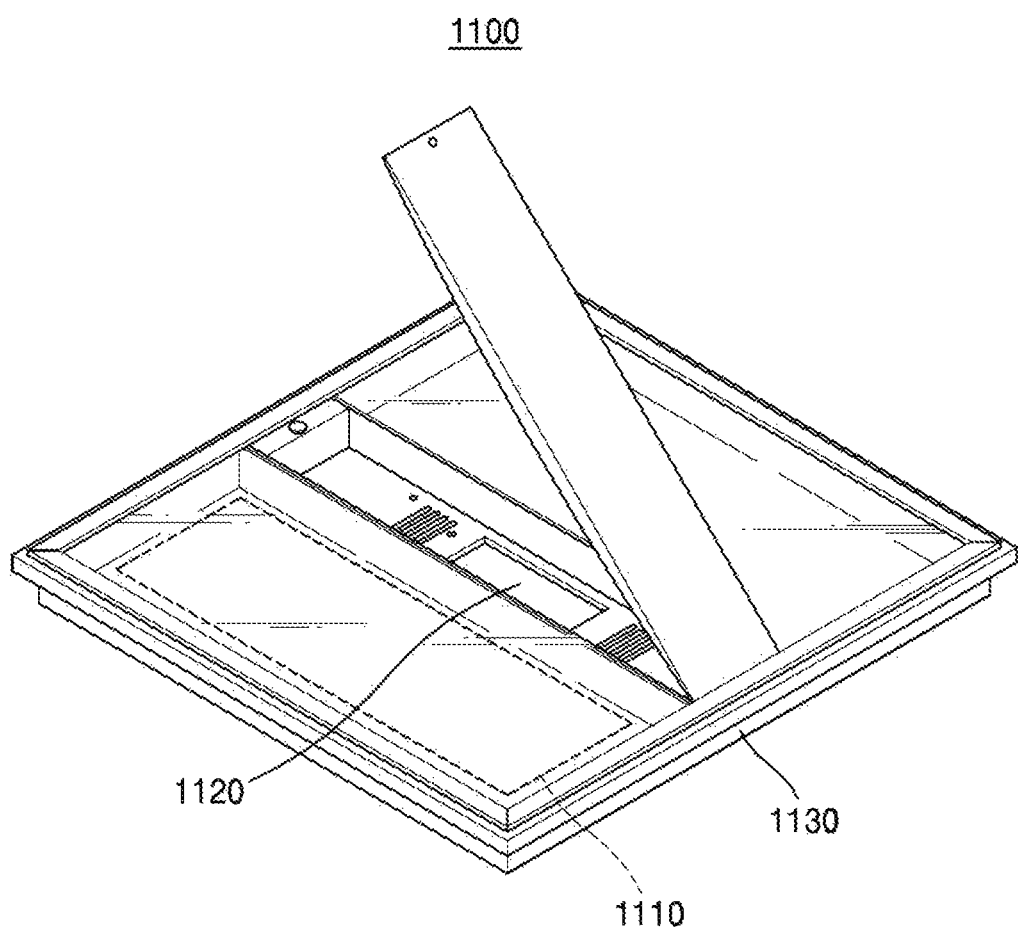
FIG. 15 is a schematic diagram of a flat semiconductor light emitting device including an LED module according to exemplary embodiment.

FIG. 15 is a schematic diagram of a flat semiconductor light emitting device including an LED module according to an exemplary embodiment.

Referring to FIG. 15, a flat semiconductor light emitting device 1100 may include a light source 1110, a power supply 1120, and a housing 1130. The light source 1110 may include an LED array including the LED modules 100, 200, 200' according to the exemplary embodiments, which are described with reference to FIGS. 1, 7, and 12. In addition, the light source 1110 may include the LED array including at least one of the optical lenses 10, 20, 30, 40, 50, 50' described with reference to FIGS. 2A to 2E, 5A to 6B, 8A to 8D, and 11A to 11C. The light source 1110 may include the LED array, and may be formed in a flat shape as a whole.

The power supply 1120 may be configured to supply power to the light source 1110.

The housing 1130 may include a receiving space so as to receive the light source 1110 and the power supply 1120 therein, and may be formed in a hexahedral shape having one open side, without being limited thereto. The light source 1110 may be arranged to emit light through the open side of the housing 1130.

Figure 16:
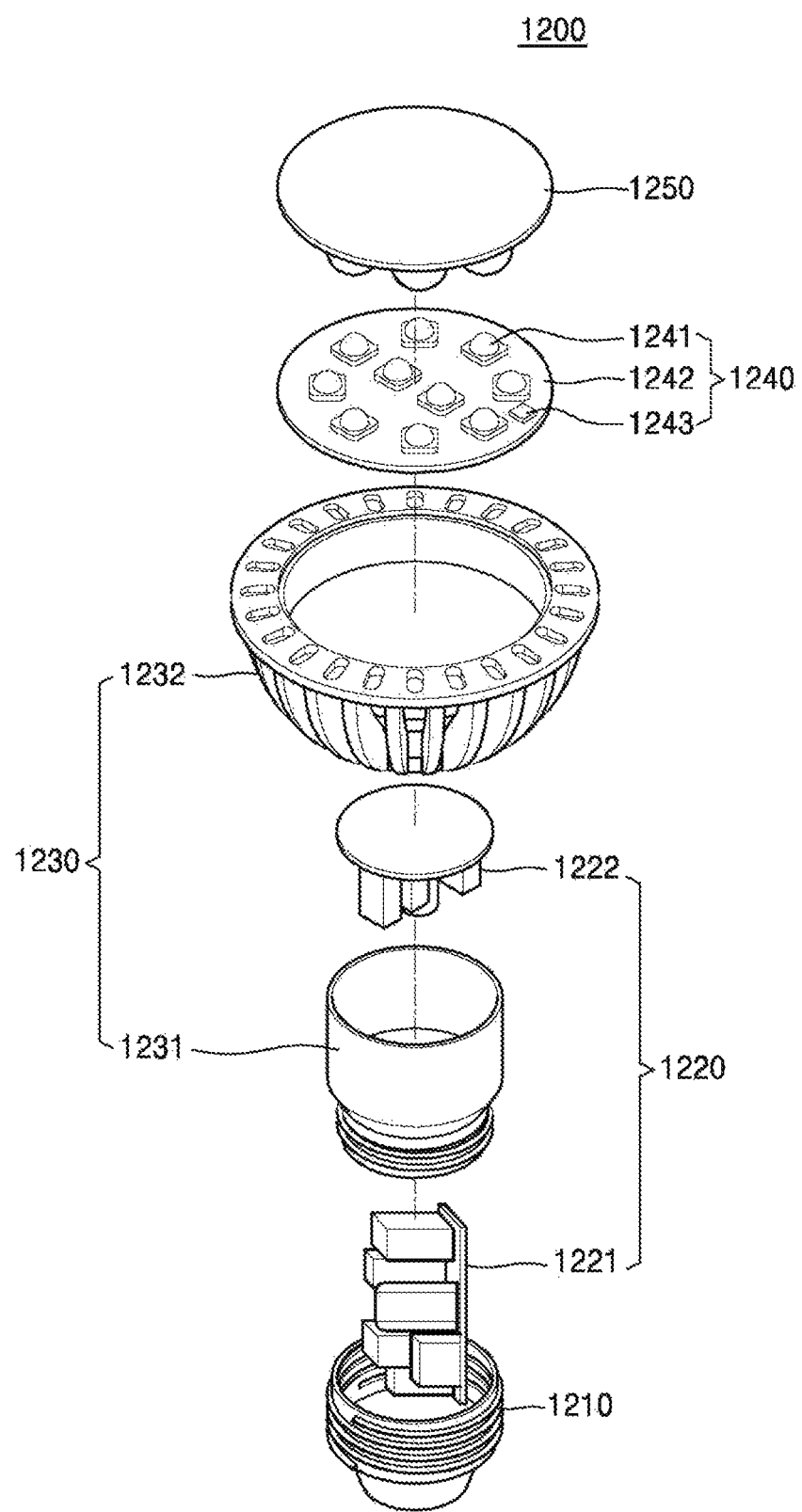
FIG. 16 is a schematic diagram of a bulb type lamp as a semiconductor light emitting device including an LED module according to exemplary embodiment.

FIG. 16 is a schematic diagram of a bulb type lamp as a semiconductor light emitting device including an LED module according to an exemplary embodiment.

Referring to FIG. 16, a semiconductor light emitting device 1200 may include a socket 1210, a power source unit 1220, a heat discharging unit 1230, a light source 1240, and an optical unit 1250. The light source 1240 may include an LED array including the LED modules 100, 200, 200' according to the exemplary embodiments, which are described with reference to FIGS. 1, 7, and 12. In addition, the light source 1240 may include the LED array including at least one of the optical lenses 10, 20, 30, 40, 50, 50' described with reference to FIGS. 2A to 2E, 5A to 6B, 8A to 8D, and 11A to 11C.

The socket 1210 may be configured such that the semiconductor light emitting device 1200 can replace existing illumination devices. Power supplied to the semiconductor light emitting device 1200 may be applied through the socket 1210. The power source unit 1220 may include a first power source unit 1221 and a second power source unit 1222.

The heat discharging unit 1230 may include an inner heat discharging unit 1231 and an outer heat discharging unit 1232. The inner heat discharging unit 1231 may be connected directly to the light source 1240 and/or the power source unit 1220, and thus allow heat to be transferred to the outer heat discharging unit 1232. The optical unit 1250 may include an inner optical unit and an outer optical unit, and may be configured to uniformly dispersing light emitted by the light source 1240.

The light source 1240 may be supplied with power from the power source unit 1220 and emit light toward the optical unit 1250. The light source 1240 may include the light emitting device array including the light emitting device according to the exemplary embodiments as set forth above. The light source 1240 may include one or more light emitting device packages 1241, a circuit board 1242, and a rank storing unit 1243 which may store rank information of the light emitting device packages 1241.

The plurality of light emitting device packages 1241 included in the light source 1240 may be the same kinds of light emitting device packages generating light of the same wavelength. Alternatively, the light emitting device packages 1241 may include various heterogeneous light emitting device packages generating light of different wavelengths.

For example, the light emitting device packages 1241 may include an LED, which emits white light by combining a yellow, green, red, or orange phosphor with a blue LED, and at least one of violet, blue, green, red, and infra-red LEDs, thereby controlling a color temperature and a color rendering index (CRI) of white light. Alternatively, when an LED chip emits blue light, the LED packages including at least one of yellow, green, and red phosphors may emit white light of various color temperatures according to mixing ratios of the phosphors. Alternatively, the light emitting device packages, in which a green or red phosphor is applied to the blue LED chip, may emit green or red light. The light emitting device package emitting white light may be combined with the package emitting green or red light, thereby controlling a color temperature and a color rendering index of white light. In addition, the light emitting device packages may include at least one of light emitting devices emitting violet, blue, green, red, and infra-red light.

While t one or more exemplary embodiments have been particularly shown and described above, it will be understood that various changes in form and details may be made therein without departing from the spirit and scope of the following claims. It should be understood that the exemplary embodiments described therein should be considered in a descriptive sense only and not for purposes of limitation.

What is claimed is:

1. A light emitting diode (LED) module comprising:
a light emitting chip on a substrate; and
an optical lens on the substrate configured to envelop the light emitting chip,
wherein the optical lens comprises a body comprising a groove receiving the light emitting chip and having a dome-shaped upper surface and a ring-shaped supporting portion protruding from a lower surface of the body,
wherein the supporting portion comprises a plurality of arcs which are arranged in an imaginary circle at a constant distance from a center of the groove and are spaced apart from each other by a gap measured along the imaginary circle.

2. The LED module according to claim 1, further comprising an LED package, including a cup-structured package body in which the light emitting chip is arranged, on the substrate.

3. The LED module according to claim 2, wherein the groove envelops at least a portion of a sidewall of the LED package.

4. The LED module according to claim 2, wherein the supporting portion envelops a side wall of the LED package.

5. The LED module according to claim 1, wherein each of the plurality of arcs is longer than the gap measured along the imaginary circle.

6. The LED module according to claim 1, wherein the plurality of arcs have the same length.

7. The LED module according to claim 1, further comprising an LED package, and wherein the gap is a path for discharging heat generated from the LED package.

8. The LED module according to claim 1, wherein the supporting portion and the substrate are secured to each other via an adhesive, wherein the adhesive is formed in some portions of a region in which the substrate and the supporting portion adjoin each other.

9. The LED module according to claim 1, wherein the substrate is a printed circuit board.

10. The LED module according to claim 1, further comprising a controller arranged on the substrate.

11. A light emitting diode (LED) module comprising:
a light emitting chip mounted on a substrate; and
an optical lens configured to envelop the light emitting chip,
wherein the optical lens comprises:
a body comprising a groove receiving the light emitting chip and having a dome-shaped upper surface; and
a plurality of supporting portions configured to protrude from a lower surface of the body and to be arranged at a constant distance from a center of the groove,
wherein the plurality of supporting portions are arranged in an imaginary circle at a constant distance from a center of the groove and are spaced apart from each other by a gap measured along the imaginary circle.

12. The LED module according to claim 11, wherein adjoining supporting portions among the plurality of supporting portions are offset from each other by sixty degrees or less along the imaginary circle.

13. The LED module according to claim 12, wherein the adjoining supporting portions among the plurality of supporting portions are offset from each other by a constant angle along the imaginary circle.

14. The LED module according to claim 11, wherein the optical lens further comprises a sidewall along an edge of the body, wherein the sidewall comprises at least three alignment marks arranged at a constant distance from the center of the groove.

15. The LED module according to claim 14, wherein the at least three alignment marks are holes penetrating through the sidewall.

16. The LED module according to claim 11, wherein a central portion of an upper surface of the body has a recessed shape.

17. An optical lens for a light emitting diode (LED) module, the optical lens comprising:
- a body having a dome structure and comprising a groove receiving an LED package including a light emitting chip on a substrate;
- a supporting portion having a ring structure and protruding from a lower surface of the body; and
- a sidewall along an edge of the body,
- wherein the supporting portion comprises a plurality of arcs which are arranged in an imaginary circle at a constant distance from a center of the groove and are spaced apart from each other by a gap measured along the imaginary circle.

18. The optical lens according to claim 17, wherein the sidewall comprises at least three alignment marks arranged at a constant distance from the center of the groove.

* * * * *